(12) United States Patent
Jee et al.

(10) Patent No.: US 12,218,102 B2
(45) Date of Patent: Feb. 4, 2025

(54) SEMICONDUCTOR PACKAGE

(71) Applicant: Samsung Electronics Co., Ltd., Suwon-si (KR)

(72) Inventors: Youngkun Jee, Cheonan-si (KR); Unbyoung Kang, Hwaseong-si (KR); Sanghoon Lee, Seongnam-si (KR); Chungsun Lee, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 467 days.

(21) Appl. No.: 17/728,727

(22) Filed: Apr. 25, 2022

(65) Prior Publication Data

US 2023/0074933 A1 Mar. 9, 2023

(30) Foreign Application Priority Data

Sep. 6, 2021 (KR) .................. 10-2021-0118547

(51) Int. Cl.
| | |
|---|---|
| *H01L 25/065* | (2023.01) |
| *H01L 23/00* | (2006.01) |
| *H01L 23/48* | (2006.01) |

(52) U.S. Cl.
CPC .......... *H01L 25/0657* (2013.01); *H01L 24/32* (2013.01); *H01L 23/481* (2013.01); *H01L 2224/32147* (2013.01); *H01L 2225/06524* (2013.01); *H01L 2225/06541* (2013.01); *H01L 2225/06548* (2013.01); *H01L 2225/06565* (2013.01); *H01L 2225/06589* (2013.01); *H01L 2924/1431* (2013.01); *H01L 2924/1436* (2013.01); *H01L 2924/1511* (2013.01); *H01L 2924/15311* (2013.01)

(58) Field of Classification Search
CPC ............................ H01L 25/0657; H01L 24/32
See application file for complete search history.

(56) References Cited

U.S. PATENT DOCUMENTS

| | | | | |
|---|---|---|---|---|
| 7,576,433 | B2 * | 8/2009 | Ishino ...................... | G11C 5/02 257/668 |
| 8,461,690 | B2 | 6/2013 | Yoshida et al. | |
| 9,184,153 | B2 * | 11/2015 | Lu ........................... | H01L 24/94 |
| 9,324,683 | B2 | 4/2016 | Min et al. | |
| 10,424,495 | B2 * | 9/2019 | Hembree ................ | H01L 21/56 |

(Continued)

FOREIGN PATENT DOCUMENTS

KR         101099587 B1     12/2011

*Primary Examiner* — William A Harriston
(74) *Attorney, Agent, or Firm* — Harness, Dickey & Pierce, P.L.C.

(57) ABSTRACT

A semiconductor package includes a first semiconductor chip including a first semiconductor substrate, and a plurality of first through electrodes penetrating at least a portion of the first semiconductor substrate. A plurality of second semiconductors include a second semiconductor substrate, the plurality of second semiconductor chips being stacked on the first semiconductor chip. A plurality of bonding pads are arranged between the first semiconductor chip and the plurality of second semiconductor chips. A chip bonding insulating layer is arranged between the first semiconductor chip and the plurality of second semiconductor chips. At least one supporting dummy substrate is stacked on the plurality of second semiconductor chips and having a support bonding insulating layer arranged on a lower surface thereof.

20 Claims, 28 Drawing Sheets

(56) References Cited

U.S. PATENT DOCUMENTS

| | | | |
|---|---|---|---|
| 10,461,036 B2 | 10/2019 | Yu et al. | |
| 10,635,535 B2 | 4/2020 | Cha et al. | |
| 10,672,674 B2 | 6/2020 | Yu et al. | |
| 10,770,445 B2 | 9/2020 | Han | |
| 12,046,573 B2* | 7/2024 | Kim | H01L 24/16 |
| 2011/0074017 A1* | 3/2011 | Morifuji | H01L 21/78 |
| | | | 257/E23.06 |
| 2011/0147945 A1* | 6/2011 | Yoshida | H01L 23/3135 |
| | | | 257/774 |
| 2013/0076387 A1* | 3/2013 | Ishikawa | G11C 29/025 |
| | | | 257/774 |
| 2013/0099368 A1* | 4/2013 | Han | H01L 23/13 |
| | | | 257/713 |
| 2015/0048493 A1* | 2/2015 | Min | H01L 24/95 |
| | | | 438/109 |
| 2015/0132893 A1* | 5/2015 | Chan | H01L 24/11 |
| | | | 438/113 |
| 2016/0013114 A1* | 1/2016 | Vadhavkar | H01L 23/4275 |
| | | | 257/713 |
| 2018/0068958 A1* | 3/2018 | Cho | H01L 25/0657 |
| 2019/0259743 A1* | 8/2019 | Han | H01L 25/0657 |
| 2020/0402888 A1 | 12/2020 | Tsutsui et al. | |
| 2020/0411483 A1 | 12/2020 | Uzoh et al. | |
| 2022/0165643 A1* | 5/2022 | Son | H01L 24/16 |

\* cited by examiner

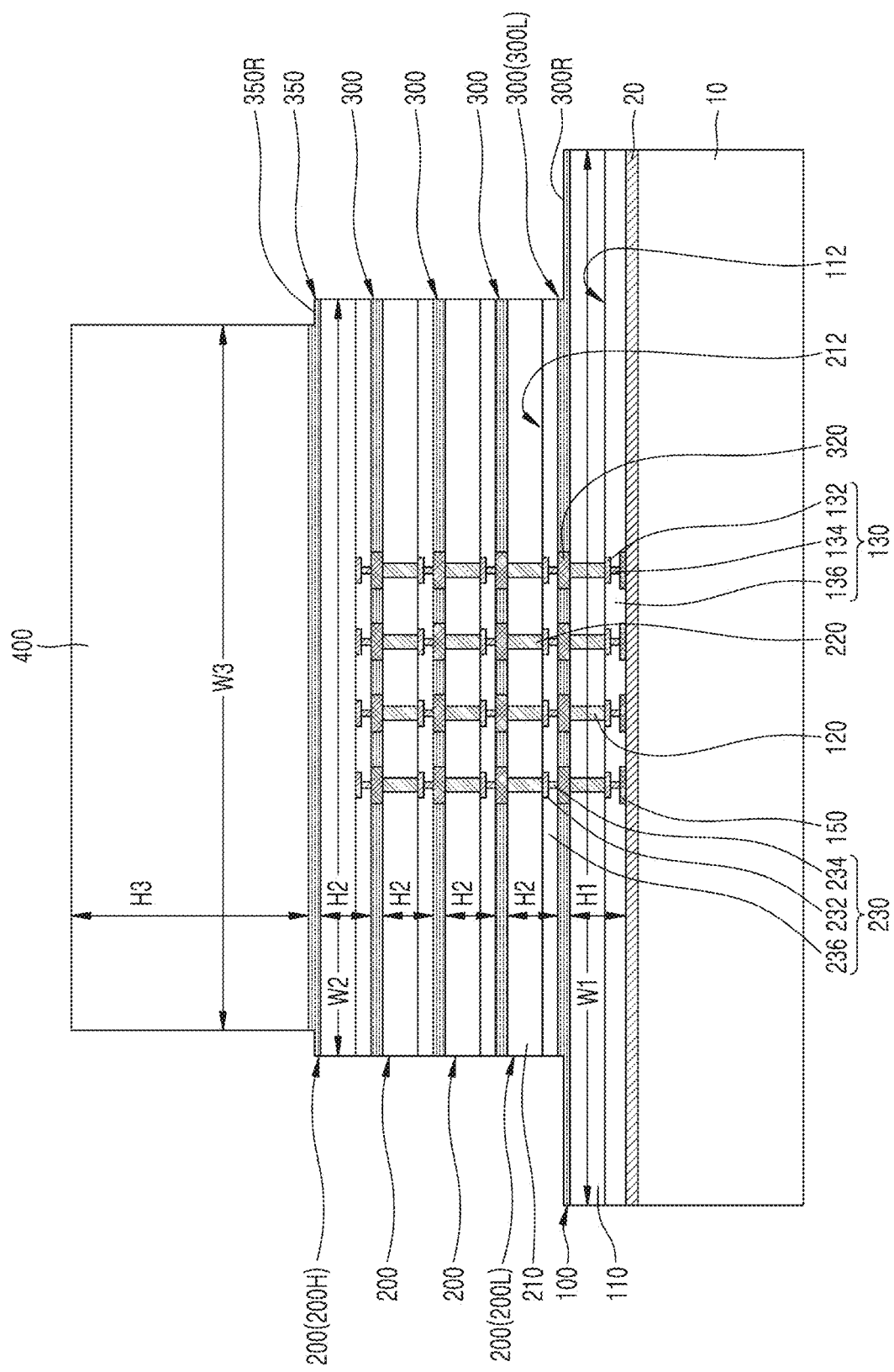

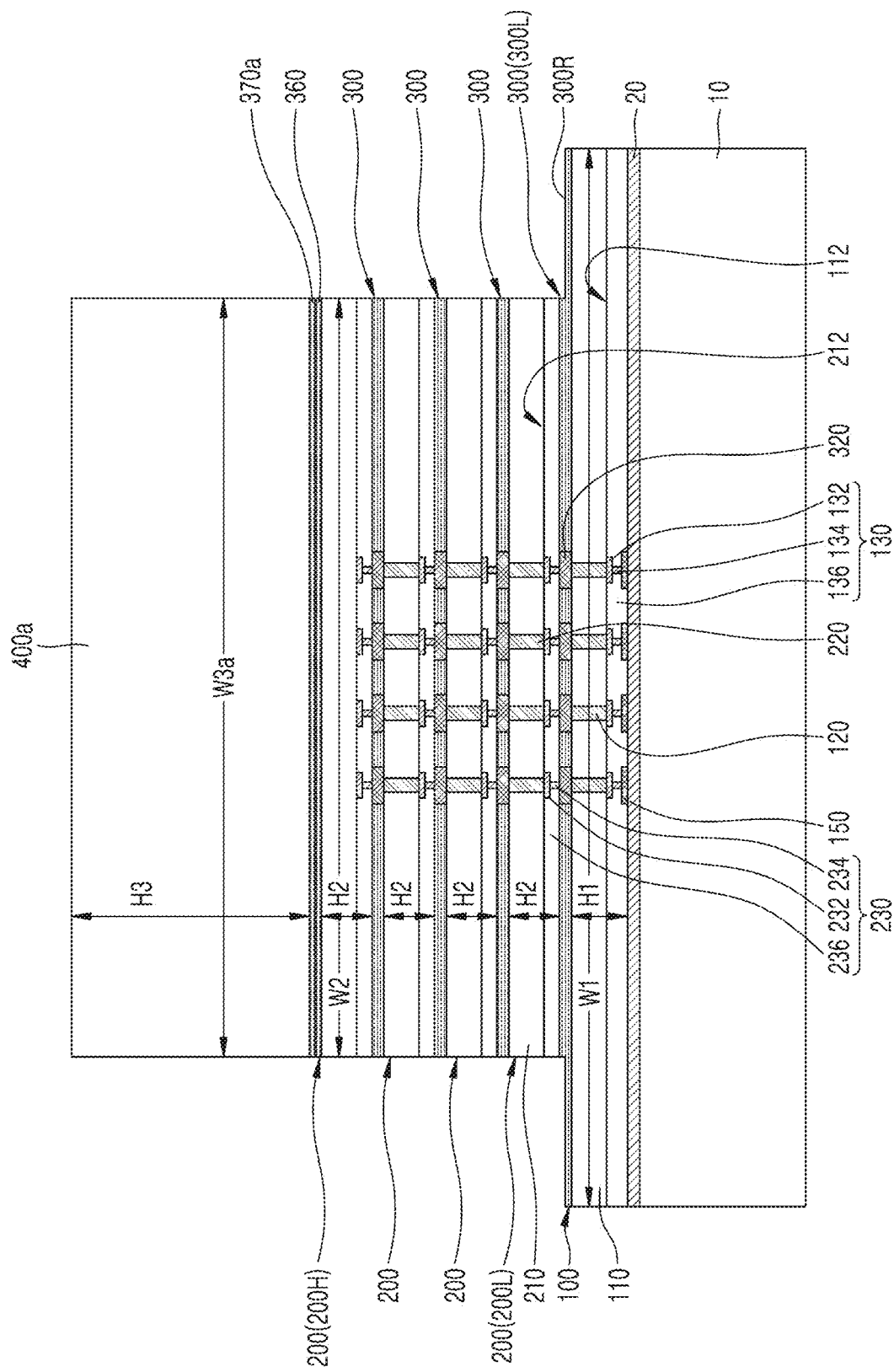

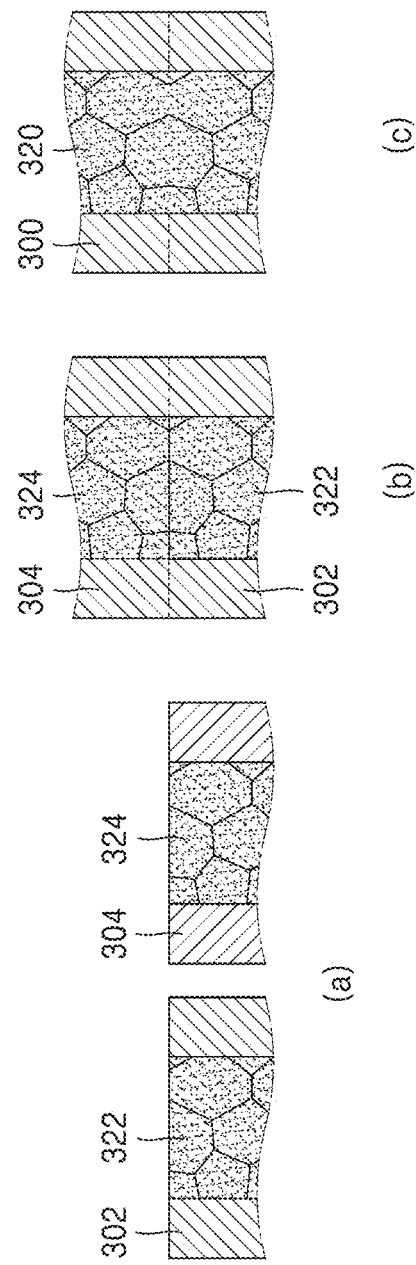

SEMICONDUCTOR PACKAGE

CROSS-REFERENCE TO RELATED APPLICATION

This application is based on and claims priority under 35 U.S.C. § 119 to Korean Patent Application No. 10-2021-0118547, filed on Sep. 6, 2021, in the Korean Intellectual Property Office, the disclosure of which is incorporated by reference herein in its entirety.

BACKGROUND

The inventive concepts relate to a semiconductor package, and more particularly, to a semiconductor package having stacked semiconductor chips.

As miniaturization, high capacity, and high performance of electronic products are desired, high integration and high speed of semiconductor packages are also desired. For this, a semiconductor package having a plurality of semiconductor chips including stacked semiconductor chips has been developed.

SUMMARY

The inventive concepts provide a semiconductor package having stacked semiconductor chips and having improved structural reliability.

To achieve the above technical problem, the inventive concepts provide a semiconductor package as follows.

According to an aspect of the inventive concepts, there is provided a semiconductor package including: a first semiconductor chip including a first semiconductor substrate having an active surface and an inactive surface opposite to each other, and the first semiconductor chip including a plurality of first through electrodes penetrating at least a portion of the first semiconductor substrate; a plurality of second semiconductor chips including a second semiconductor substrate having an active surface and an inactive surface opposite to each other, the active surface of the second semiconductor substrate facing the inactive surface of the first semiconductor substrate, the plurality of second semiconductor chips being stacked on the first semiconductor chip; a plurality of bonding pads arranged between the first semiconductor chip and the plurality of second semiconductor chips; a chip bonding insulating layer configured to surround the plurality of bonding pads and arranged between the first semiconductor chip and the plurality of second semiconductor chips; and at least one supporting dummy substrate stacked on the plurality of second semiconductor chips and having a support bonding insulating layer arranged on a lower surface thereof, wherein at least some of the plurality of second semiconductor chips include a plurality of second through electrodes penetrating at least a portion of the second semiconductor substrate, wherein the plurality of bonding pads electrically connect the plurality of first through electrodes to the plurality of second through electrodes, wherein a total vertical height of the at least one supporting dummy substrate is greater than respective vertical heights of the first semiconductor chip and the plurality of second semiconductor chips.

According to another aspect of the inventive concepts, there is provided a semiconductor package including: a high bandwidth memory (HBM) controller die including a first semiconductor substrate having an active surface and an inactive surface opposite to each other, and the HBM controller die including a plurality of first through electrodes penetrating at least a portion of the first semiconductor substrate; a plurality of dynamic random access memory (DRAM) dies including a second semiconductor substrate having an active surface and an inactive surface opposite to each other, the active surface of the second semiconductor substrate facing the inactive surface of the first semiconductor substrate, the plurality of DRAM dies being stacked on the first semiconductor substrate; a plurality of bonding pads arranged between the HBM controller die and the plurality of DRAM dies; a chip bonding insulating layer configured to surround the plurality of bonding pads and arranged between the HBM controller die and the plurality of DRAM dies; and a plurality of supporting dummy substrates sequentially stacked on the plurality of DRAM dies and having a support bonding insulating layer attached to each lower surface thereof, wherein remaining DRAM dies except for an uppermost DRAM die among the plurality of DRAM dies includes a plurality of second through electrodes penetrating at least a portion of the second semiconductor substrate and electrically connected to the plurality of first through electrodes through the plurality of bonding pads, wherein a vertical height of each of the plurality of supporting dummy substrates is equal to or less than a vertical height of each of the first semiconductor substrate and the plurality of DRAM dies, wherein a total vertical height of the plurality of supporting dummy substrates is greater than respective vertical heights of the first semiconductor substrate and the plurality of DRAM dies.

According to another aspect of the inventive concepts, there is provided a semiconductor package including: a high bandwidth memory (HBM) controller die including a first semiconductor substrate having an active surface and an inactive surface opposite to each other, and the HBM controller die including a plurality of first through electrodes penetrating at least a portion of the first semiconductor substrate, the HBM controller die having a first horizontal width and a first vertical height; a plurality of DRAM dies including a second semiconductor substrate having an active surface and an inactive surface opposite to each other, the active surface of the second semiconductor substrate facing the inactive surface of the first semiconductor substrate and is stacked on a first semiconductor chip, the plurality of DRAM dies each having a second horizontal width less than the first horizontal width and a second vertical height; a plurality of bonding pads arranged between the HBM controller die and the plurality of DRAM dies; a chip bonding insulating layer configured to surround the plurality of bonding pads and arranged between the HBM controller die and the plurality of DRAM dies; a plurality of supporting dummy substrates having a support bonding insulating layer attached to each lower surface thereof and sequentially stacked on the plurality of DRAM dies, and each having a third horizontal width less than the second horizontal width and a third vertical height equal to or less than the first vertical height and the second vertical height; and a package molding layer that covers an upper surface of the HBM controller die, side surfaces of the plurality of DRAM dies, and side surfaces of the plurality of supporting dummy substrates, but exposes an upper surface of an uppermost supporting dummy substrate among the plurality of supporting dummy substrates without covering the upper surface of an uppermost supporting dummy substrate, wherein vertical heights of the plurality of supporting dummy substrates are greater than the first vertical height and the second vertical height.

BRIEF DESCRIPTION OF THE DRAWINGS

Embodiments of the inventive concepts will be more clearly understood from the following detailed description taken in conjunction with the accompanying drawings in which:

FIGS. 5A to 5I are cross-sectional views illustrating a method of manufacturing a semiconductor package, according to example embodiments;

FIGS. 6A and 6B are cross-sectional views illustrating a method of manufacturing a semiconductor package, according to example embodiments;

FIGS. 9 to 11 are cross-sectional views for conceptually explaining a process of forming a bonding pad in a method of manufacturing a semiconductor package, according to an embodiment of the inventive concepts.

Corresponding reference numerals indicate corresponding parts throughout the several views of the drawings.

DETAILED DESCRIPTION OF THE EMBODIMENTS

Figure 1A:
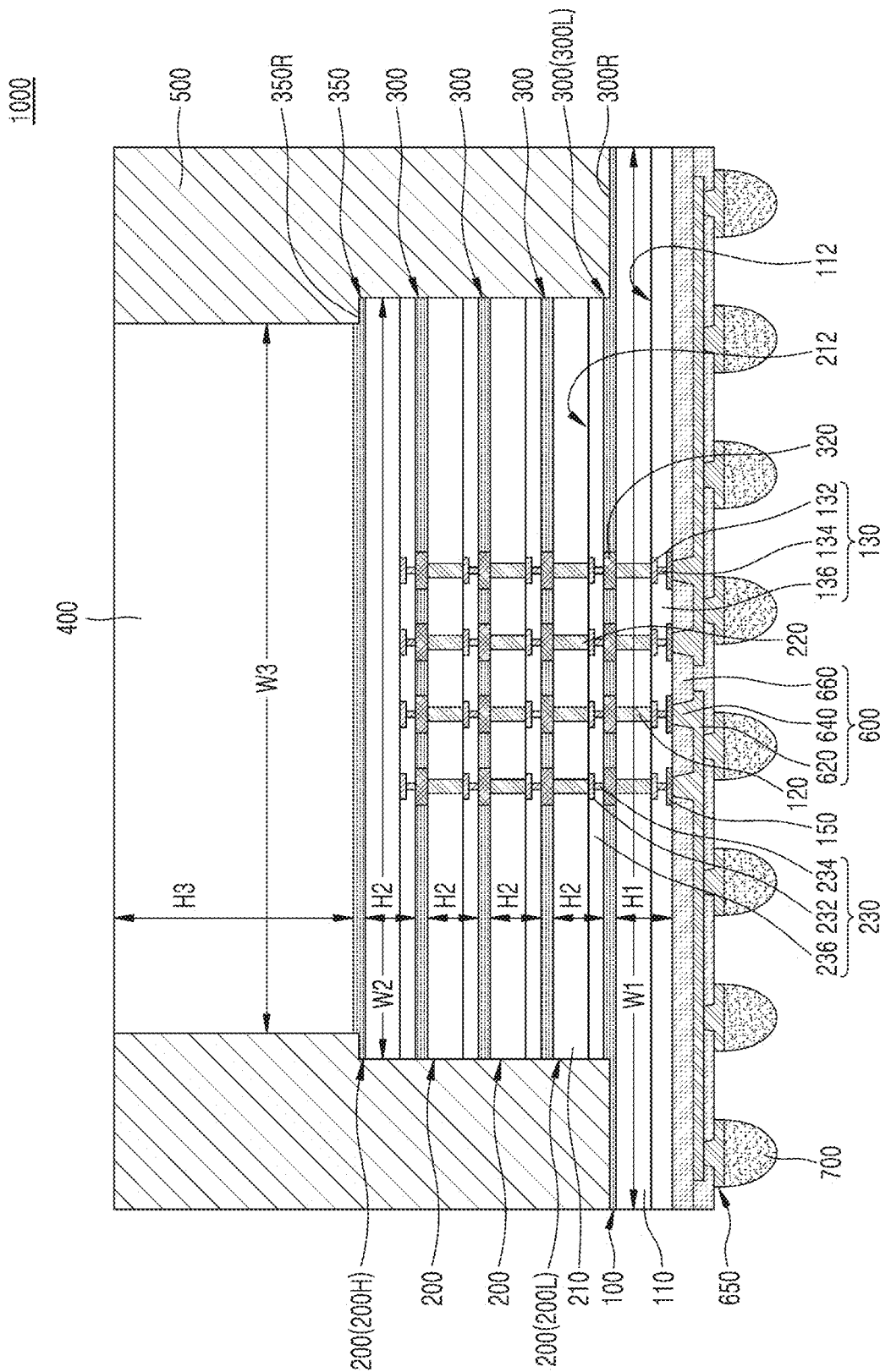
FIGS. 1A to 4B are each a cross-sectional view illustrating a semiconductor package according to an example embodiment of the inventive concepts.

Example embodiments will now be described more fully with reference to the accompanying drawings.

FIGS. 1A to 4B are each a cross-sectional view illustrating a semiconductor package according to an example embodiment of the inventive concepts. In FIGS. 1A to 4B, the same reference numerals denote the same members, and repeated descriptions may be omitted.

Referring to FIG. 1A, a semiconductor package 1000 includes a first semiconductor chip 100 and a plurality of second semiconductor chips 200. Although the semiconductor package 1000 is illustrated as including four second semiconductor chips 200 in FIG. 1A, the inventive concepts are not limited thereto. For example, the semiconductor package 1000 may include two or more second semiconductor chips 200. In some embodiments, the semiconductor package 1000 may include a multiple of 4 second semiconductor chips 200. The plurality of second semiconductor chips 200 may be sequentially stacked on the first semiconductor chip 100. For convenience of description, the lowermost second semiconductor chip 200 among the plurality of second semiconductor chips 200 may be referred to as a lowermost second semiconductor chip 200L, and the uppermost second semiconductor chip 200 may be referred to as an uppermost second semiconductor chip 200H.

The first semiconductor chip 100 and the plurality of second semiconductor chips 200 included in the semiconductor package 1000 may be electrically connected through a plurality of bonding pads 320 to exchange signals and provide power and a ground. For example, the plurality of bonding pads 320 may be arranged between the first semiconductor chip 100 and the lowermost second semiconductor chip 200L, and between two adjacent second semiconductor chips 200, respectively.

For example, the plurality of bonding pads 320 may be made of a material including Cu. Among the plurality of bonding pads 320, the bonding pad 320 arranged between the first semiconductor chip 100 and the lowermost second semiconductor chip 200L may be referred to as a first bonding pad, and the bonding pad 320 arranged between two adjacent second semiconductor chips 200 may be referred to as a second bonding pad.

The first semiconductor chip 100 may include a first semiconductor substrate 110 having an active surface and an inactive surface opposite to each other, a first semiconductor element 112 formed on the active surface of the first semiconductor substrate 110, a first wiring structure 130 formed on the active surface of the first semiconductor substrate 110, and a plurality of first through electrodes 120 connected to the first wiring structure 130 and penetrating at least a portion of the first semiconductor chip 100. The first semiconductor chip 100 may further include a plurality of chip pads 150 arranged on a lower surface thereof and electrically connected to a first wiring pattern 132 and/or a first wiring via 134. The plurality of chip pads 150 may be electrically connected to the first semiconductor element 112 or the first wiring structure 130 through the first wiring pattern 132 and/or the first wiring via 134.

In the semiconductor package 1000, the first semiconductor chip 100 may be arranged such that an active surface of the first semiconductor substrate 110 faces downward and an inactive surface of the first semiconductor substrate 110 faces upward. Therefore, unless otherwise stated in this specification, the upper surface of the first semiconductor chip 100 of the semiconductor package 1000 refers to the side toward which the inactive surface of the first semiconductor substrate 110 faces, and the lower surface of the first semiconductor chip 100 refers to the side toward which the active surface thereof faces. However, when describing the first semiconductor chip 100 as a reference, the lower surface of the first semiconductor chip 100 toward which the active surface of the first semiconductor substrate 110 faces may be referred to as the front surface of the first semiconductor chip 100, and the upper surface of the first semiconductor chip 100 toward which the inactive surface faces may be referred to as the rear surface of the first semiconductor chip 100.

The second semiconductor chip 200 may include a second semiconductor substrate 210 having an active surface and an inactive surface opposite to each other, a second semiconductor element 212 formed on the active surface of the second semiconductor substrate 210, and a second wiring structure 230 formed on the active surface of the second semiconductor substrate 210.

At least some of the second semiconductor chips 200 of the plurality of second semiconductor chips 200 may further include a plurality of second through electrodes 220 connected to the second wiring structure 230 and penetrating at least a portion of the second semiconductor chip 200. In some embodiments, among the plurality of second semiconductor chips 200, the uppermost second semiconductor chip 200H, which is the second semiconductor chip 200 that is arranged furthest from the first semiconductor chip 100 and positioned at the uppermost end of the semiconductor package 1000, may not include a plurality of second through electrodes 220.

Only the second semiconductor substrate 210 may be exposed at the upper surface of the uppermost second semiconductor chip 200H. That is, only a semiconductor material may be at the upper surface of the uppermost second semiconductor chip 200H.

In some embodiments, among the plurality of second semiconductor chips 200, a vertical height, that is, thickness, of the uppermost second semiconductor chip 200H and a vertical height, that is, thickness, of the remaining second semiconductor chips 200 may have substantially the same value.

In the semiconductor package 1000, each of the plurality of second semiconductor chips 200 may be sequentially stacked on the first semiconductor chip 100 in a vertical direction while the active surface faces downward, that is, the first semiconductor chip 100. Therefore, unless otherwise stated in this specification, the upper surface of the second semiconductor chip 200 of the semiconductor package 1000 refers to the side toward which the inactive surface of the second semiconductor substrate 210 faces, and the lower surface of the second semiconductor chip 200 refers to the side toward which the active surface of the second semiconductor substrate 210 faces. However, when describing the second semiconductor chip 200 as a reference, the lower surface of the second semiconductor chip 200 toward which the active surface of the second semiconductor substrate 210 faces may be referred to as the front surface of the first semiconductor chip 200, and the upper surface of the second semiconductor chip 200 toward which the inactive surface faces may be referred to as the rear surface of the second semiconductor chip 200.

The first semiconductor substrate 110 and the second semiconductor substrate 210 may include, for example, a semiconductor material such as silicon (Si). Alternatively, the first semiconductor substrate 110 and the second semiconductor substrate 210 may include a semiconductor material such as germanium (Ge). Each of the first semiconductor substrate 110 and the second semiconductor substrate 210 may have an active surface and an inactive surface opposite to the active surface. The first semiconductor substrate 110 and the second semiconductor substrate 210 may include conductive regions, for example, wells doped with impurities. The first semiconductor substrate 110 and the second semiconductor substrate 210 may have various device isolation structures such as a shallow trench isolation (STI) structure.

Each of the first semiconductor element 112 and the second semiconductor element 212 may include a plurality of individual devices of various types. A plurality of the individual devices may include various microelectronic devices, for example, metal-oxide-semiconductor field effect transistors (MOSFETs) such as complementary metal-oxide-semiconductor (CMOS) transistors, system large scale integration (LSI), image sensors such as CMOS imaging sensors (CISs), micro-electro-mechanical systems (MEMS), active devices, passive devices, and the like. The plurality of individual devices may be electrically connected to the conductive region of the first semiconductor substrate 110 or the second semiconductor substrate 210. Each of the first semiconductor element 112 and the second semiconductor element 212 may further include a conductive wiring or a conductive plug electrically connecting at least two of the plurality of individual devices or the plurality of individual devices to the conductive region of each of the first semiconductor substrate 110 and the second semiconductor substrate 210. In addition, each of the plurality of individual devices may be electrically separated from neighboring individual devices by an insulating film.

At least one of the first semiconductor chip 100 and the second semiconductor chips 200 may be a memory semiconductor chip.

In some embodiments, the first semiconductor chip 100 may be a buffer chip that includes a serial-parallel conversion circuit and controls the plurality of second semiconductor chips 200, and the plurality of second semiconductor chips 200 may be memory chips including memory cells. For example, the semiconductor package 1000 including the first semiconductor chip 100 and the plurality of second semiconductor chips 200 may be a high bandwidth memory (HBM), and the first semiconductor chip 100 may be referred to as an HBM controller die, and each of the plurality of second semiconductor chips 200 may be referred to as a dynamic random access memory (DRAM) die.

The first wiring structure 130 may include a plurality of first wiring patterns 132, a plurality of first wiring vias 134 connected to the plurality of first wiring patterns 132, and a first inter-wiring insulating layer 136 surrounding the plurality of first wiring patterns 132 and the plurality of first wiring vias 134. In some embodiments, the plurality of first wiring patterns 132 may have a thickness of about 0.5 μm or less. In some embodiments, the first wiring structure 130 may have a multi-layer wiring structure including first wiring patterns 132 and first wiring vias 134 positioned at different vertical levels.

The second wiring structure 230 may include a plurality of second wiring patterns 232, a plurality of second wiring vias 234 connected to the plurality of second wiring patterns 232, and a second inter-wiring insulating layer 236 surrounding the plurality of second wiring patterns 232 and the plurality of second wiring vias 234. In some embodiments, the plurality of second wiring patterns 132 may have a thickness of about 0.5 μm or less. In some embodiments, the second wiring structure 230 may have a multi-layer wiring structure including second wiring patterns 232 and second wiring vias 234 positioned at different vertical levels.

The plurality of first wiring patterns 132, the plurality of first wiring vias 134, the plurality of second wiring patterns 232, and the plurality of second wiring vias 234 may include a metal material such as aluminum, copper, or tungsten. In some embodiments, the plurality of first wiring patterns 132, the plurality of first wiring vias 134, the plurality of second wiring patterns 232, and the plurality of second wiring vias 234 may include a barrier film for wiring and a metal layer for wiring. The barrier film for wiring may be made of a metal, a metal nitride, or an alloy. The metal layer for wiring may include at least one metal selected from W, Al, Ti, Ta, Ru, Mn, and Cu.

When the first wiring structure 130 and the second wiring structure 230 have a multi-layer wiring structure, the first inter-wiring insulating layer 136 and the second inter-wiring insulating layer 236 may have a multi-layer structure in which a plurality of insulating layers are stacked corresponding to the multi-layer wiring structure of the first wiring structure 130 and the second wiring structure 230. For example, the first inter-wiring insulating layer 136 and the second inter-wiring insulating layer 236 may be formed of silicon oxide, silicon nitride, silicon oxynitride, an insulating material having a lower dielectric constant than silicon oxide, or a combination thereof. In some embodiments, the first inter-wiring insulating layer 136 and the second inter-wiring insulating layer 236 may include a tetraethyl orthosilicate (TEOS) film or an ultra low K (ULK) film having an ultra low dielectric constant K of about 2.2 to about 2.4. The ULK film may include a SiOC film or a SiCOH film.

Each of the first through electrodes 120 and the second through electrodes 220 may be formed of a through silicon via (TSV). Each of the first through electrodes 120 and the second through electrodes 220 may include a conductive plug penetrating each of the first semiconductor substrate 110 and the second semiconductor substrate 210, and a conductive barrier film surrounding the conductive plug.

The conductive plug may have a cylindrical shape, and the conductive barrier film may have a cylindrical shape surrounding a sidewall of the conductive plug. A via insulating film is arranged between the first through electrodes 120 and the first semiconductor substrate 110 and between the second through electrodes 220 and the second semiconductor substrate 210, thereby surrounding sidewalls of the first through electrode 120 and the second through electrode 220. Of course, the first through electrodes 120 and the second through electrodes 220 may have any one of a via-first, via-middle, and via-last structure.

The first semiconductor chip 100 may have a first horizontal width W1 and a first vertical height H1, and each of the plurality of second semiconductor chips 200 may have a second horizontal width W2 and a second vertical height H2. In some embodiments, the first horizontal width W1 may have a greater value than the second horizontal width W2. In some embodiments, the first vertical height H1 may substantially be the same as the second vertical height H2. For example, the first vertical height H1 and the second vertical height H2 may be about 50 μm to about 90 μm.

The plurality of bonding pads 320 may electrically connect the second wiring pattern 232 and/or the second wiring via 234 of the second wiring structure 230 to the plurality of first through electrodes 120 or the plurality of second through electrodes 220 positioned therebelow.

For example, the second wiring pattern 232 and/or the second wiring via 234 of the second wiring structure 230 included in the lowermost second semiconductor chip 200L may be electrically connected to the plurality of first through electrodes 120 included in the first semiconductor chip 100 positioned below through the plurality of bonding pads 320, that is, the plurality of first bonding pads, and the second wiring pattern 232 and/or the second wiring via 234 of the second wiring structure 230 included in the second semiconductor chip 200 other than the lowermost second semiconductor chip 200L may be electrically connected to a plurality of second through electrodes 220 included in another second semiconductor chip 200 positioned below the plurality of bonding pads 320, that is, a plurality of second bonding pads.

The plurality of bonding pads 320 may be surrounded by the chip bonding insulating layer 300, respectively, between the first semiconductor chip 100 and the plurality of second semiconductor chips 200, that is, between the first semiconductor chip 100 and the lowermost second semiconductor chip 200L, and between the plurality of second semiconductor chips 200. The plurality of bonding pads 320 may penetrate the chip bonding insulating layer 300. Each of the plurality of chip bonding insulating layers 300 may be arranged between the first semiconductor chip 100 and the plurality of second semiconductor chips 200.

After separately forming a conductive material layer on the surfaces facing each other of two adjacent chips among the first semiconductor chip 100 and the plurality of second semiconductor chips 200, respectively, each of the plurality of bonding pads 320 may be formed by diffusion bonding such that the conductive material layers facing each other expand by heat to form an integral body through diffusion of metal atoms in contact with each other.

After separately forming an insulating material layer on the surfaces facing each other of two adjacent chips among the first semiconductor chip 100 and the plurality of second semiconductor chips 200, respectively, in the process of forming a plurality of bonding pads 320, the chip bonding insulating layer 300 may be formed by diffusion bonding so that the insulating material layers facing each other expand by heat, come into contact with each other, and form an integral body through diffusion of atoms included therein.

The lowermost chip bonding insulating layer 300L arranged between the first semiconductor chip 100 and the lowermost second semiconductor chip 200L among the plurality of chip bonding insulating layers 300 may be formed by diffusion bonding an insulating material layer covering an upper surface of the first semiconductor chip 100 and an insulating material layer covering a lower surface of the lowermost second semiconductor chip 200L.

The lowermost chip bonding insulating layer 300L may have a first recess 300R in an upper portion thereof so that the thickness of the portion that vertically overlaps with the lowermost second semiconductor chip 200L has a greater value than the portion that does not vertically overlap with the lowermost second semiconductor chip 200L. The first recess 300R may be located in a portion of the lowermost chip bonding insulating layer 300L that does not vertically overlap with the lowermost second semiconductor chip 200L. The lowermost chip bonding insulating layer 300L may have a shape in which the center portion, that is, the portion that vertically overlaps with the lowermost second semiconductor chip 200L, protrudes upward compared to the edge portion, that is, the portion that does not vertically overlap with the lowermost second semiconductor chip 200L, and may have a flat lower surface.

The lowermost chip bonding insulating layer 300L may cover all portions of the upper surface of the first semiconductor chip 100 that do not vertically overlap with the lowermost second semiconductor chip 200L. A portion of the upper surface of the first semiconductor chip 100 overlapping the lowermost second semiconductor chip 200L in the vertical direction, and a portion of the lower surface of the lowermost second semiconductor chip 200L may be covered by the plurality of bonding pads 320, and the remaining portion may be covered by the lowermost chip bonding insulating layer 300L.

The remaining chip bonding insulating layers 300 excluding the lowermost chip bonding insulating layer 300L may cover both the upper and lower surfaces of the second semiconductor chip 200 facing each other together with the plurality of bonding pads 320. The remaining chip bonding insulating layers 300 except for the lowermost chip bonding insulating layer 300L may have flat upper and lower surfaces to have substantially a same thickness.

A supporting dummy substrate 400 may be stacked on the uppermost second semiconductor chip 200H. The supporting dummy substrate 400 may include, for example, a semiconductor material such as silicon (Si). In some embodiments, the supporting dummy substrate 400 may be made only of a semiconductor material. For example, the supporting dummy substrate 400 may be part of a bare wafer.

The supporting dummy substrate 400 may have a third horizontal width W3 and a third vertical height H3. In some embodiments, the third horizontal width W3 may have a smaller value than the first horizontal width W1 and the second horizontal width W2. In some embodiments, the third vertical height H3 may be greater than the first vertical height H1 and the second vertical height H2. For example, the third vertical height H3 may be about 100 μm to about 500 μm.

A support bonding insulating layer 350 may be arranged between the uppermost second semiconductor chip 200H and the supporting dummy substrate 400. After separately forming an insulating material layer on the upper surface of the uppermost second semiconductor chip 200H and the lower surface of the supporting dummy substrate 400 facing each other, the support bonding insulating layer 350 may be formed by diffusion bonding such that the insulating material layers facing each other expand by heat to form an integral body through diffusion of atoms in contact with each other.

Only the semiconductor material may be exposed on the lower surface of the supporting dummy substrate 400 and the upper surface of the uppermost second semiconductor chip 200H. Therefore, the upper surface and the lower surface of the support bonding insulating layer 350 may contact only the semiconductor material. Because the uppermost second semiconductor chip 200H does not include the second through electrode 230, the support bonding insulating layer 350 may be spaced apart from the second through electrode 230.

The support bonding insulating layer 350 may have a second recess 350R in an upper portion thereof so that the thickness of the portion overlapping in the vertical direction with the supporting dummy substrate 400 has a greater value than the portion that does not overlap in the vertical direction with the supporting dummy substrate 400. The second recess 350R may be located in a portion of the support bonding insulating layer 350 that does not overlap the supporting dummy substrate 400 in the vertical direction. The support bonding insulating layer 350 may have a shape in which the middle portion, that is, the portion overlapping in the vertical direction with the supporting dummy substrate 400, protrudes compared to the edge portion, that is, the portion that does not overlap in the vertical direction with the supporting dummy substrate 400 and may have a flat lower surface.

The support bonding insulating layer 350 may cover both the lower surface of the supporting dummy substrate 400 and the upper surface of the uppermost second semiconductor chip 200H. The support bonding insulating layer 350 may fill both the space between the lower surface of the supporting dummy substrate 400 and the upper surface of the uppermost second semiconductor chip 200H.

The lowermost chip bonding insulating layer 300L may have a first horizontal width W1, and the remaining chip bonding insulating layer 300 except for the lowermost chip bonding insulating layer 300L may have a second horizontal width W2, and the support bonding insulating layer 350 may have a second horizontal width W2. The remaining chip bonding insulating layers 300 except for the lowermost chip bonding insulating layer 300L may overlap the plurality of second semiconductor chips 200 in a vertical direction. The remaining chip bonding insulating layer 300 except for the lowermost chip bonding insulating layer 300L and the side surface of each of the plurality of second semiconductor chips 200 may be aligned with each other in a vertical direction to form a coplanar surface.

The chip bonding insulating layer 300 and the support bonding insulating layer 350 may be made of any one of SiO, SiN, SiCN, SiCO, and a polymer material. The polymer material may be benzocyclobutene (BCB), polyimide (PI), polybenzoxazole (PBO), silicone, acrylate, or epoxy. For example, the chip bonding insulating layer 300 and the support bonding insulating layer 350 may be made of silicon oxide. In some embodiments, the chip bonding insulating layer 300 and the support bonding insulating layer 350 may be made of the same material. The chip bonding insulating layer 300 and the support bonding insulating layer 350 may have a thickness of, for example, about 100 nm to about 1 μm.

The semiconductor package 1000 may further include a package molding layer 500 covering the upper surface of the first semiconductor chip 100 and surrounding the side surfaces of the plurality of second semiconductor chips 200 and the supporting dummy substrate 400 on the first semiconductor chip 100. The package molding layer 500 may include, for example, an epoxy mold compound (EMC). In some embodiments, the package molding layer 500 may cover the upper surface of the supporting dummy substrate 400. In some other embodiments, the package molding layer 500 may not cover the upper surface of the supporting dummy substrate 400. For example, a heat dissipation member may be attached on the supporting dummy substrate 400 with a thermal interface material (TIM) arranged therebetween.

In some embodiments, the semiconductor package 100 may further include a base rewiring layer 600 arranged on a lower surface of the first semiconductor chip 100. The base rewiring layer 600 may include a plurality of package rewiring line patterns 620, a plurality of package rewiring vias 640, and a package rewiring insulating layer 660. In some embodiments, a plurality of package rewiring insulating layers 660 may be stacked. The package rewiring insulating layer 660 may be formed of, for example, a photo imageable dielectric (PID) or a photosensitive polyimide (PSPI). The package rewiring line pattern 620 and the package rewiring via 640 may include, for example, a metal such as copper (Cu), aluminum (Al), tungsten (W), titanium (Ti), tantalum (Ta), indium (In), molybdenum (Mo), manganese (Mn), cobalt (Co), tin (Sn), Nickel (Ni), magnesium (Mg), rhenium (Re), beryllium (Be), gallium (Ga), ruthenium (Ru), and the like, or an alloy thereof, but is not limited thereto. In some embodiments, the package rewiring line pattern 620 and the package rewiring via 640 may be formed by laminating a metal or an alloy of a metal on a seed layer including titanium, titanium nitride, or titanium tungsten.

The plurality of package rewiring line patterns 620 may be arranged on at least one of an upper surface and a lower surface of the package rewiring insulating layer 660. The plurality of package rewiring vias 640 may pass through the package rewiring insulating layer 660 to be in contact with a portion of the plurality of package rewiring line patterns 620, respectively. In some embodiments, at least some of the plurality of package rewiring line patterns 620 may be formed together with some of the plurality of package rewiring vias 640 to form an integral body. For example, the package rewiring line pattern 620 and the package rewiring via 640 in contact with the upper surface of the package rewiring line pattern 620 may form an integral body. The package rewiring insulating layer 660 may cover the plurality of package rewiring line patterns 620 and the plurality of package rewiring vias 640.

The plurality of package rewiring line patterns 620 and the plurality of package rewiring vias 640 may be electrically connected to the plurality of chip pads 150. In some embodiments, at least some of the plurality of rewiring vias 640 may contact the plurality of chip pads 150. For example, when the package rewiring layer 600 includes a plurality of stacked package rewiring insulating layers 660, the rewiring via 640 penetrating the uppermost package rewiring insulating layer 660 may be electrically connected to the chip pad 150.

In some embodiments, the plurality of package rewiring vias 640 may have a tapered shape that horizontally narrows and extends from the bottom to the top. That is, the plurality of package rewiring vias 640 may have a wider horizontal width away from the first semiconductor chip 100.

Among the plurality of package rewiring line patterns 620, the package rewiring line pattern 620 arranged on the lower surface of the package rewiring layer 600 may be referred to as a package pad 650. A plurality of package connection terminals 700 may be attached to the plurality of package pads 650. For example, the package connection terminal 700 may be a solder ball or a bump.

In some embodiments, the semiconductor package 1000 may not include the package rewiring layer 600. For example, the plurality of package connection terminals 700 may be attached to the plurality of chip pads 150.

The horizontal width and horizontal area of the package rewiring layer 600 may have the same values as the horizontal width and horizontal area of the first semiconductor chip 100. The package rewiring layer 600 and the first semiconductor chip 100 may overlap each other in a vertical direction.

For example, the horizontal widths and the horizontal areas of the package rewiring layer 600, the first semiconductor chip 100, and the package molding layer 500 may have substantially the same value. The side surfaces of each of the package rewiring layer 600, the first semiconductor chip 100, and the package molding layer 500 may be aligned with each other in a vertical direction to form a coplanar surface.

The semiconductor package 1000 according to the inventive concepts may be formed by stacking the first semiconductor chip 100 and the plurality of second semiconductor chips 200 by hybrid bonding in which a plurality of bonding pads 320 and the chip bonding insulating layer 300 are formed by diffusion bonding. Because the first semiconductor chip 100 and the plurality of second semiconductor chips 200 are substantially the same and have a relatively thin thickness (vertical height), in the process of performing hybrid bonding, bending may occur flexibly, so that a bonding defect may be prevented or reduced from occurring between the first semiconductor chip 100 and the plurality of second semiconductor chips 200, and stress may be prevented or reduced from being concentrated on the bonded first semiconductor chip 100 and plurality of second semiconductor chips 200 while the subsequent thermal process is performed.

Because the semiconductor package 1000 according to the inventive concepts has a supporting dummy substrate 400 having a relatively thick thickness (vertical height), the structural reliability of the semiconductor package 1000 may be improved, and heat dissipation to the outside of the semiconductor package 1000 may be smooth through the supporting dummy substrate 400. The supporting dummy substrate 400 and the uppermost second semiconductor chip 200H are bonded by a support bonding insulating layer 350, and the upper and lower surfaces of the support bonding insulating layer 350 may only be in contact with the semiconductor material constituting the supporting dummy substrate 400 and the uppermost second semiconductor chip 200H. Therefore, the supporting dummy substrate 400 has a thickness that is thick enough to have rigidity that does not cause bending, so that even if a bonding defect occurs between the uppermost second semiconductor chips 200H, operation reliability of the semiconductor package 1000 may not be affected.

Figure 1B:
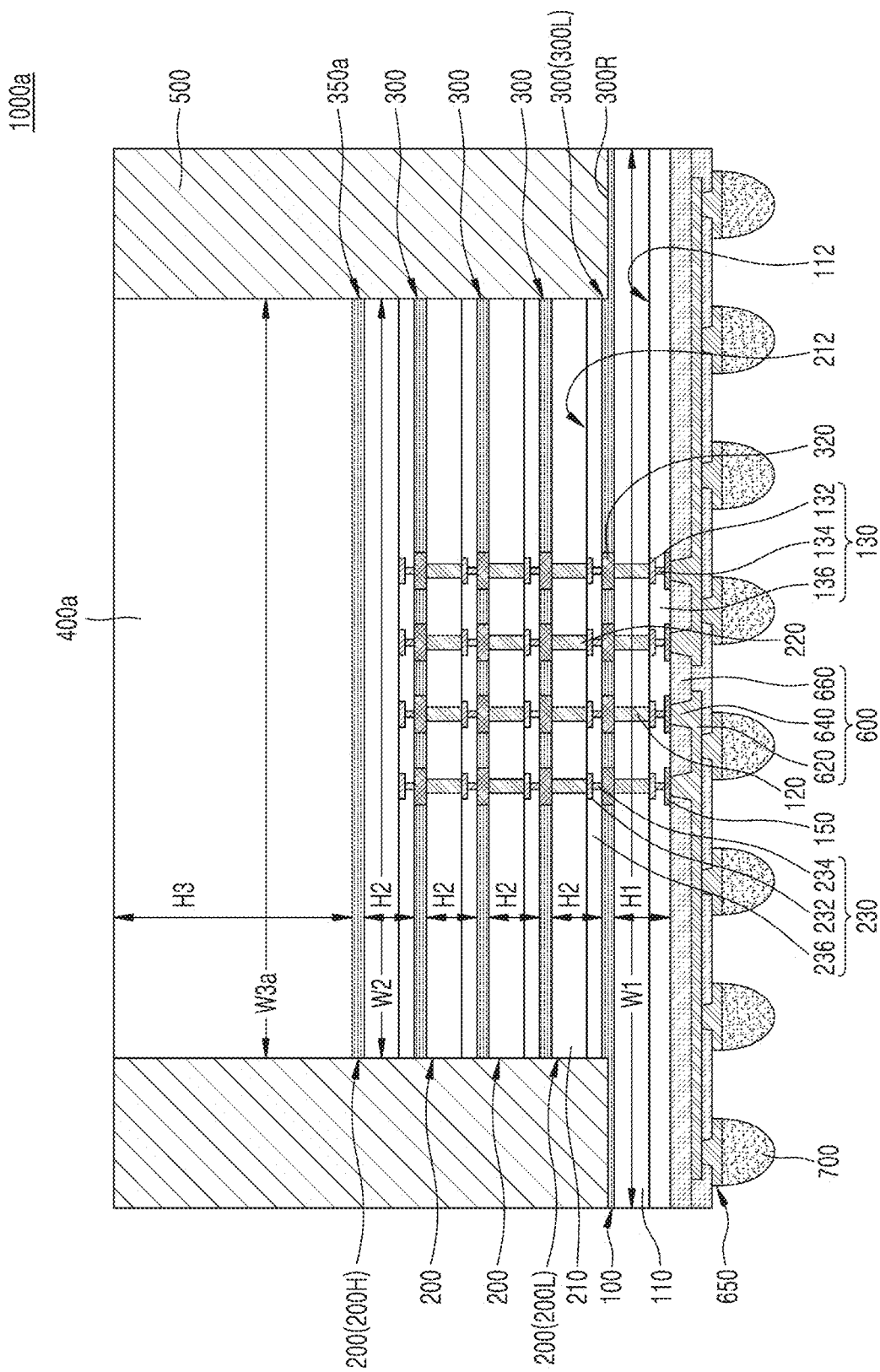

Referring to FIG. 1B, a semiconductor package 1000a includes a first semiconductor chip 100 and a plurality of second semiconductor chips 200. The first semiconductor chip 100 and the plurality of second semiconductor chips 200 included in the semiconductor package 1000 may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A supporting dummy substrate 400a may be stacked on the uppermost second semiconductor chip 200H. The supporting dummy substrate 400a may include, for example, a semiconductor material such as silicon. In some embodiments, the supporting dummy substrate 400a may be made only of a semiconductor material. For example, the supporting dummy substrate 400a may be a part of a bare wafer.

The supporting dummy substrate 400a may have a third horizontal width W3a and a third vertical height H3. In some embodiments, the third horizontal width W3a and the second horizontal width W2 may have substantially the same value. In some embodiments, the third vertical height H3 may be greater than the first vertical height H1 and the second vertical height H2.

A support bonding insulating layer 350a may be arranged between the uppermost second semiconductor chip 200H and the supporting dummy substrate 400a. After separately forming an insulating material layer on the upper surface of the uppermost second semiconductor chip 200H and the lower surface of the supporting dummy substrate 400a facing each other, the support bonding insulating layer 350a may be formed by diffusion bonding such that the insulating material layers facing each other expand by heat to form an integral body through diffusion of atoms in contact with each other.

Only the semiconductor material may be exposed on the lower surface of the supporting dummy substrate 400a and the upper surface of the uppermost second semiconductor chip 200H. Therefore, the upper surface and the lower surface of the support bonding insulating layer 350a may contact only the semiconductor material.

The support bonding insulating layer 350a may cover both the lower surface of the supporting dummy substrate 400a and the upper surface of the uppermost second semiconductor chip 200H. The support bonding insulating layer 350a may fill all the space between the lower surface of the supporting dummy substrate 400a and the upper surface of the uppermost second semiconductor chip 200H. The support bonding insulating layer 350a may have flat upper and lower surfaces to have substantially a same thickness.

The lowermost chip bonding insulating layer 300L may have a first horizontal width W1, and the chip bonding insulating layer 300 except for the lowermost chip bonding insulating layer 300L may have a second horizontal width W2, and the support bonding insulating layer 350a may have a second horizontal width W2. The chip bonding insulating layer 300 excluding the lowermost chip bonding insulating layer 300L, the plurality of second semiconductor chips 200, the plurality of support bonding insulating layers 350a, and the supporting dummy substrates 400a may overlap each other in a vertical direction. Each side surface of the chip bonding insulating layer 300 excluding the lowermost chip bonding insulating layer 300L, the second semiconductor chips 200, the support bonding insulating layers 350a, and the supporting dummy substrates 400a may be aligned with each other in the vertical direction to form a coplanar surface.

The semiconductor package 1000a may further include a package molding layer 500 covering the upper surface of the first semiconductor chip 100 and surrounding the side surfaces of the plurality of second semiconductor chips 200 and the supporting dummy substrate 400a on the first semiconductor chip 100. In some embodiments, the package molding layer 500 may cover the upper surface of the supporting dummy substrate 400a. In some other embodiments, the package molding layer 500 may not cover the upper surface of the supporting dummy substrate 400a.

Figure 2A:
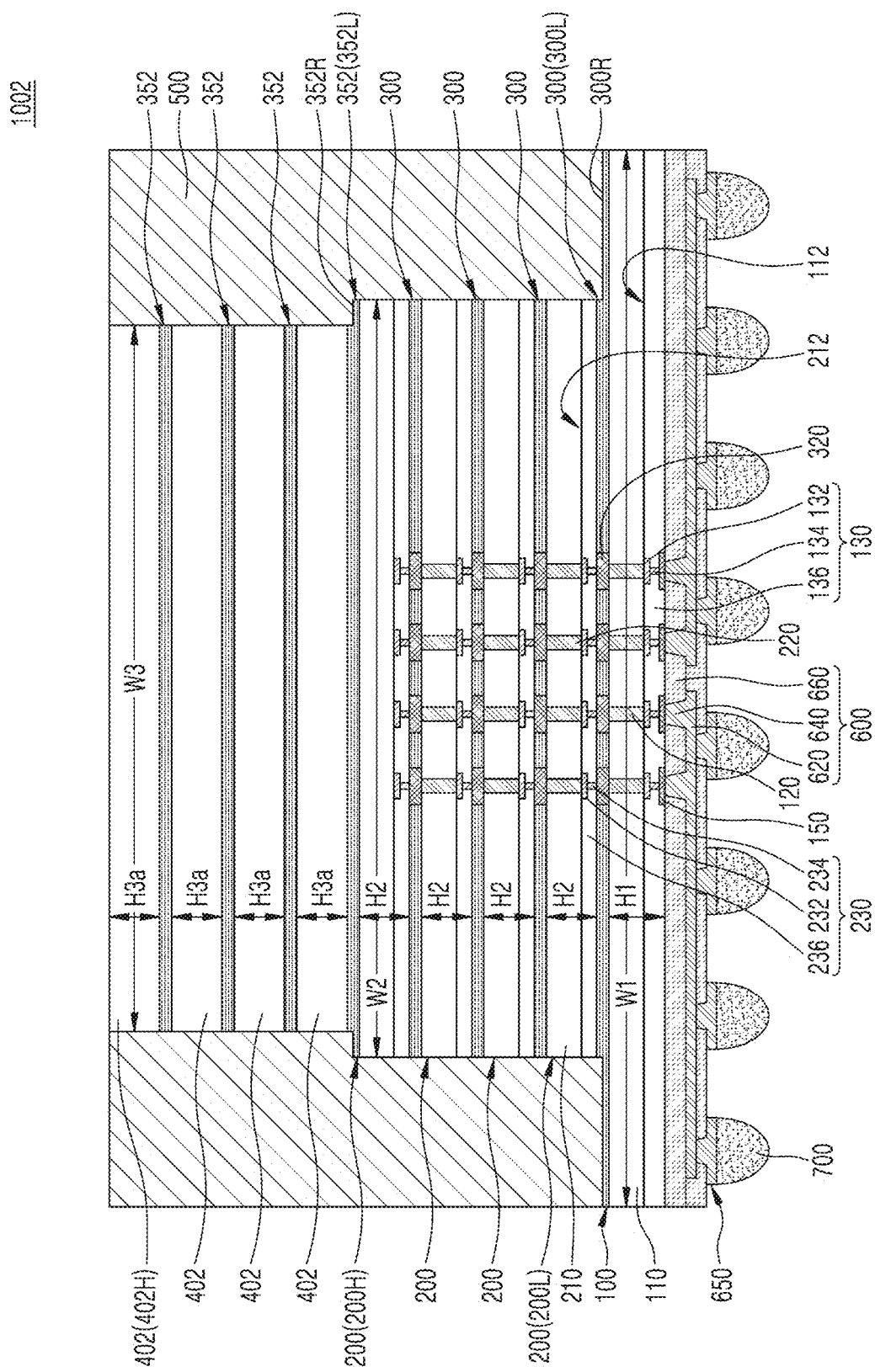

Referring to FIG. 2A, the semiconductor package 1002 includes a first semiconductor chip 100 and a plurality of second semiconductor chips 200. The first semiconductor chip 100 and the plurality of second semiconductor chips 200 included in the semiconductor package 1002 may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 402 may be stacked on the uppermost second semiconductor chip 200H. The plurality of supporting dummy substrates 402 may include, for example, a semiconductor material such as silicon. In some embodiments, the plurality of supporting dummy substrates 402 may be made of only semiconductor material. For example, each of the plurality of supporting dummy substrates 402 may be a part of a bare wafer. The total vertical height of the stacked plurality of supporting dummy substrates 402 may be greater than the second vertical height H2. For example, the vertical height of the entire stacked plurality of supporting dummy substrates 402 may be about 100 µm to about 500 µm.

Each of the plurality of supporting dummy substrates 402 may have a third horizontal width W3 and a third vertical height H3a. In some embodiments, the third horizontal width W3 may have a smaller value than the first horizontal width W1 and the second horizontal width W2. In some embodiments, the third vertical height H3a may have substantially the same value as the first vertical height H1 and the second vertical height H2. For example, the third vertical height H3a may be about 50 µm to about 90 µm. In some other example embodiments, the third vertical height H3a may be less than the first vertical height H1 and the second vertical height H2. For example, the third vertical height H3a may have substantially the same value as the vertical heights of the first semiconductor substrate 110 and the second semiconductor substrate 210, and may be several µm less than the first vertical height H1 and the second vertical height H2.

In some embodiments, the vertical height H3a of the uppermost supporting dummy substrate 402H positioned at the top of the plurality of supporting dummy substrates 402 may have a smaller value than the vertical height of the remaining supporting dummy substrates 402.

A support bonding insulating layer 352 may be arranged between the uppermost second semiconductor chip 200H and the plurality of supporting dummy substrates 402, that is, between the uppermost second semiconductor chip 200H and the lowermost supporting dummy substrate 402, and between the plurality of supporting dummy substrates 402, respectively.

Only the semiconductor material may be exposed on the upper surface of the uppermost second semiconductor chip 200H, the lower surface of the lowermost supporting dummy substrate 402, and the upper surface of the uppermost supporting dummy substrate 402H. Therefore, the upper surface and the lower surface of the support bonding insulating layer 352 may contact only the semiconductor material.

Among the plurality of support bonding insulating layers 352, the support bonding insulating layer 352 arranged between the uppermost second semiconductor chip 200H and the lowermost supporting dummy substrate 402 may be referred to as the lowermost support bonding insulating layer 352L. The lowermost support bonding insulating layer 352L may have a second recess 352R in an upper portion thereof so that the thickness of the portion overlapping in the vertical direction with the lowermost supporting dummy substrate 402 has a greater value than the portion that does not overlap in the vertical direction with the lowermost supporting dummy substrate 402. The second recess 352R may be located in a portion of the lowermost support bonding insulating layer 352L that does not overlap the supporting dummy substrates 402 in the vertical direction. The lowermost support bonding insulating layer 352L may have a shape in which the middle portion, that is, the portion overlapping in the vertical direction with the supporting dummy substrates 402 protrudes upward compared to the edge portion, that is, the portion that does not overlap in the vertical direction with the supporting dummy substrates 402 and may have a flat lower surface.

The lowermost support bonding insulating layer 352L may cover both the lower surface of the lowermost supporting dummy substrates 402 and the upper surface of the uppermost second semiconductor chip 200H. The lowermost support bonding insulating layer 352L may fill all the space between the lower surface of the lowermost supporting dummy substrates 402 and the upper surface of the uppermost second semiconductor chip 200H.

The remaining support bonding insulating layer 352 except for the lowermost support bonding insulating layer 352L may cover both the upper surface and the lower surface of the supporting dummy substrates 402 facing each other. The remaining support bonding insulating layer 352 except for the lowermost support bonding insulating layer 352L may have a flat upper surface and a flat lower surface to have substantially the same thickness.

Figure 2B:
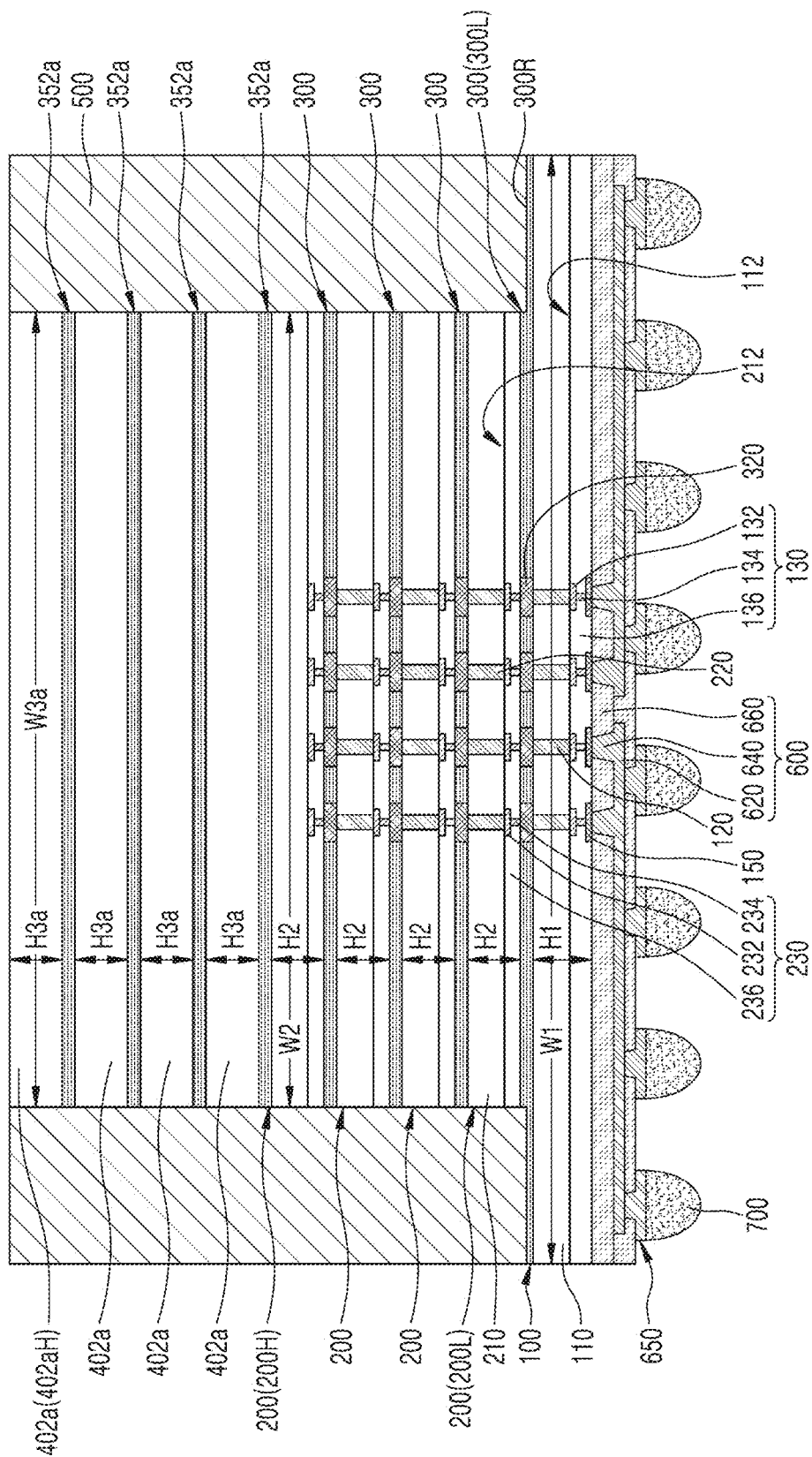

Referring to FIG. 2B, a semiconductor package 1002a includes a first semiconductor chip 100 and a plurality of second semiconductor chips 200. The first semiconductor chip 100 and the plurality of second semiconductor chips 200 included in the semiconductor package 1000 may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 402a may be stacked on the uppermost second semiconductor chip 200H. The plurality of supporting dummy substrates 402a may include, for example, a semiconductor material such as silicon. In some embodiments, the plurality of supporting dummy substrates 402a may be made of only semiconductor material. For example, each of the plurality of supporting dummy substrates 402a may be a part of a bare wafer.

Each of the plurality of supporting dummy substrates 402a may have a third horizontal width W3a and a third vertical height H3a. In some embodiments, the third horizontal width W3a and the second horizontal width W2 may have substantially a same value.

A support bonding insulating layer 352a may be arranged between the uppermost second semiconductor chip 200H and the plurality of supporting dummy substrates 402a, that is, between the uppermost second semiconductor chip 200H and the lowermost supporting dummy substrate 402a, and between the plurality of supporting dummy substrates 402a, respectively.

The support bonding insulating layer 352a may cover both the lower surface of the lowermost supporting dummy substrate 402a and the upper surface of the uppermost second semiconductor chip 200H, and the lower and upper surfaces of the plurality of supporting dummy substrates 402a facing each other. The support bonding insulating layer 352a may have flat upper and lower surfaces to have substantially the same thickness.

The support bonding insulating layer 352a may have a third horizontal width W3a. The chip bonding insulating layer 300 excluding the lowermost chip bonding insulating layer 300L, the plurality of second semiconductor chips 200, the plurality of support bonding insulating layers 352a, and the plurality of supporting dummy substrates 402a may overlap each other in a vertical direction. Each side surface of the chip bonding insulating layer 300 excluding the lowermost chip bonding insulating layer 300L, the plurality of second semiconductor chips 200, the plurality of support bonding insulating layers 352a, and the plurality of supporting dummy substrates 402a may be aligned with each other in the vertical direction to form a coplanar surface.

Figure 3A:
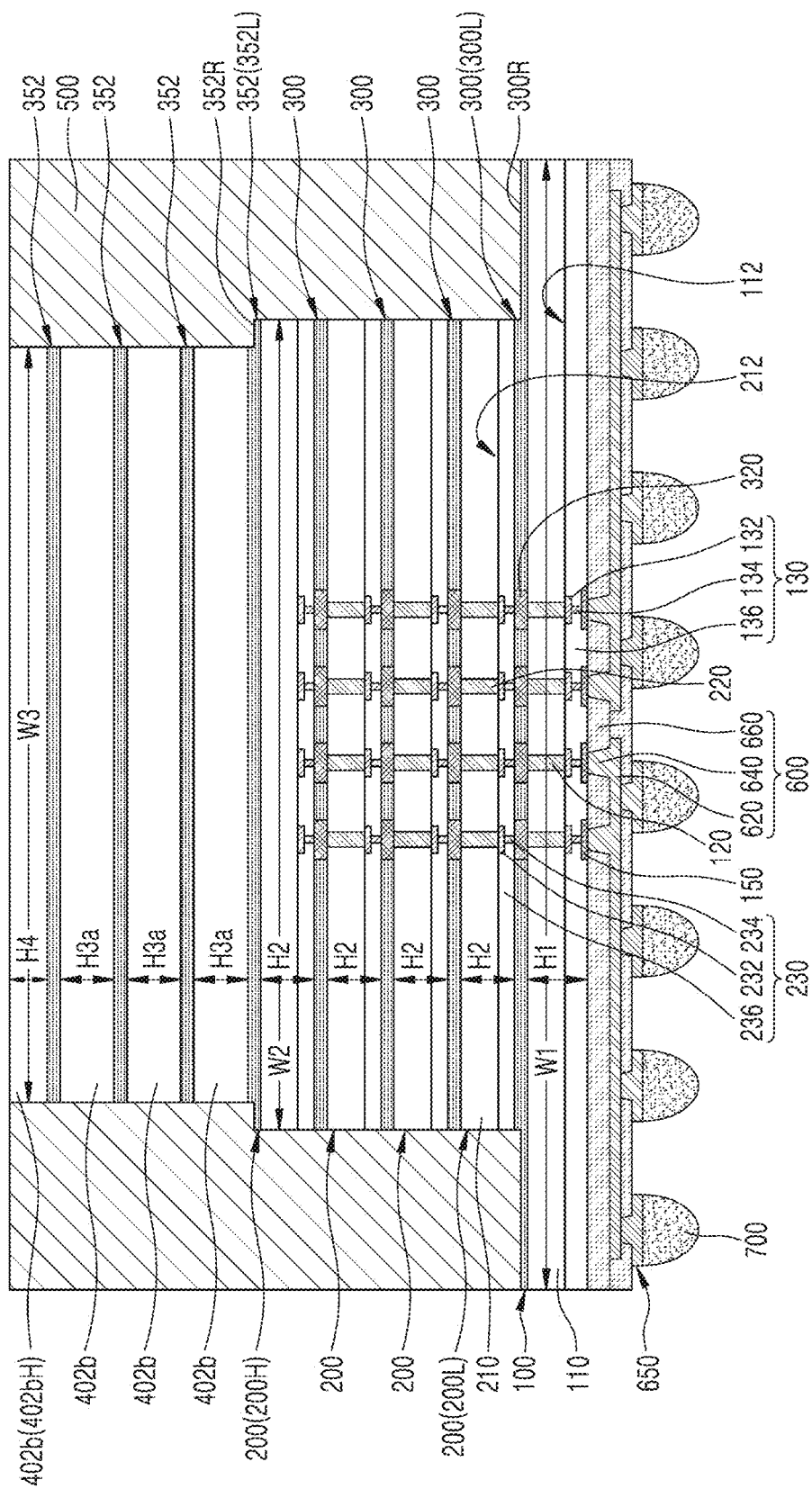

Referring to FIG. 3A, a semiconductor package 1004 includes a first semiconductor chip 100 and a plurality of second semiconductor chips 200. The first semiconductor chip 100 and the plurality of second semiconductor chips 200 included in the semiconductor package 1004 may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 402b may be stacked on the uppermost second semiconductor chip 200H. The plurality of supporting dummy substrates 402b may include, for example, a semiconductor material such as silicon. In some embodiments, the plurality of supporting dummy substrates 402b may be made of only semiconductor material. For example, each of the plurality of supporting dummy substrates 402b may be a part of a bare wafer. Among the plurality of supporting dummy substrates 402b, the uppermost supporting dummy substrate 402b may be referred to as the uppermost supporting dummy substrate 402bH. The total vertical height of the stacked plurality of supporting dummy substrates 402b may be greater than the second vertical height W2. For example, the vertical height of the entire stacked plurality of supporting dummy substrates 402b may be about 100 μm to about 500 μm.

Among the plurality of supporting dummy substrates 402b, the remaining supporting dummy substrate 402b except for the uppermost supporting dummy substrate 402bH may have a third horizontal width W3 and a third vertical height H3a. The uppermost supporting dummy substrate 402bH may have a third horizontal width W3 and a fourth vertical height H4. The fourth vertical height H4 may have a smaller value than the third vertical height H3a. For example, the fourth vertical height H4 may be several μm less than the third vertical height H3a.

A support bonding insulating layer 352 may be arranged between the uppermost second semiconductor chip 200H and the plurality of supporting dummy substrates 402b, that is, between the uppermost second semiconductor chip 200H and the lowermost supporting dummy substrate 402b, and between the plurality of supporting dummy substrates 402b, respectively.

Figure 3B:
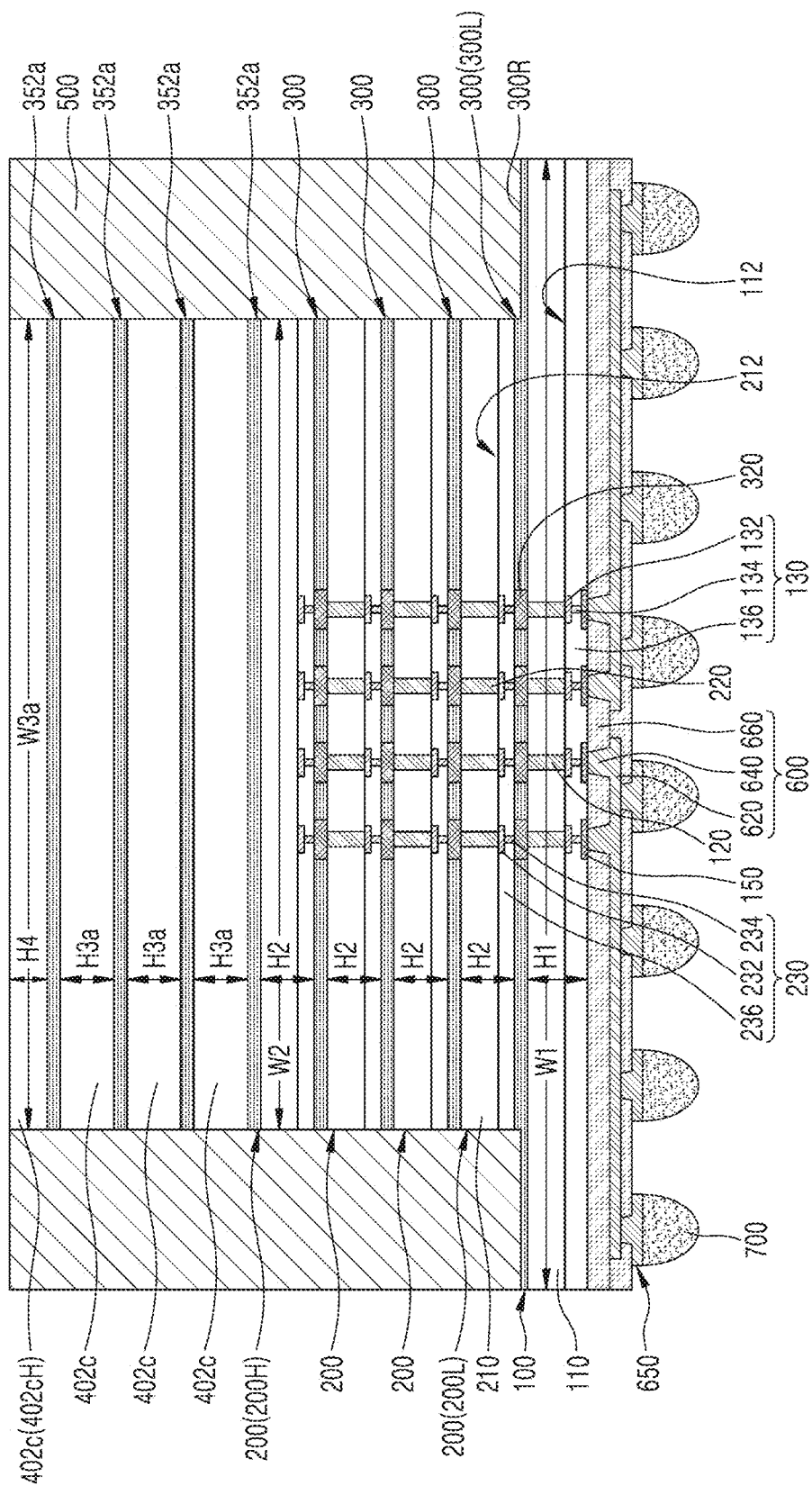

Referring to FIG. 3B, a semiconductor package 1004a includes a first semiconductor chip 100 and a plurality of second semiconductor chips 200. The first semiconductor chip 100 and the plurality of second semiconductor chips 200 included in the semiconductor package 1004a may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 402c may be stacked on the uppermost second semiconductor chip 200H. The plurality of supporting dummy substrates 402c may include, for example, a semiconductor material such as silicon. In some embodiments, the plurality of supporting dummy substrates 402c may be made of only semiconductor material. For example, each of the plurality of supporting dummy substrates 402c may be a part of a bare wafer. Among the plurality of supporting dummy substrates 402c, the uppermost supporting dummy substrate 402c may be referred to as the uppermost supporting dummy substrate 402cH.

Among the plurality of supporting dummy substrates 402c, the remaining supporting dummy substrates 402c except for the uppermost supporting dummy substrate 402cH may have a third horizontal width W3a and a third vertical height H3a. The uppermost supporting dummy substrate 402cH may have a third horizontal width W3a and a fourth vertical height H4. The fourth vertical height H4 may have a smaller value than the third vertical height H3a. For example, the fourth vertical height H4 may be several μm less than the third vertical height H3a.

A support bonding insulating layer 352a may be arranged between the uppermost second semiconductor chip 200H and the plurality of supporting dummy substrates 402c, that is, between the uppermost second semiconductor chip 200H and the lowermost supporting dummy substrate 402c, and between the plurality of supporting dummy substrates 402c, respectively.

Figure 4A:
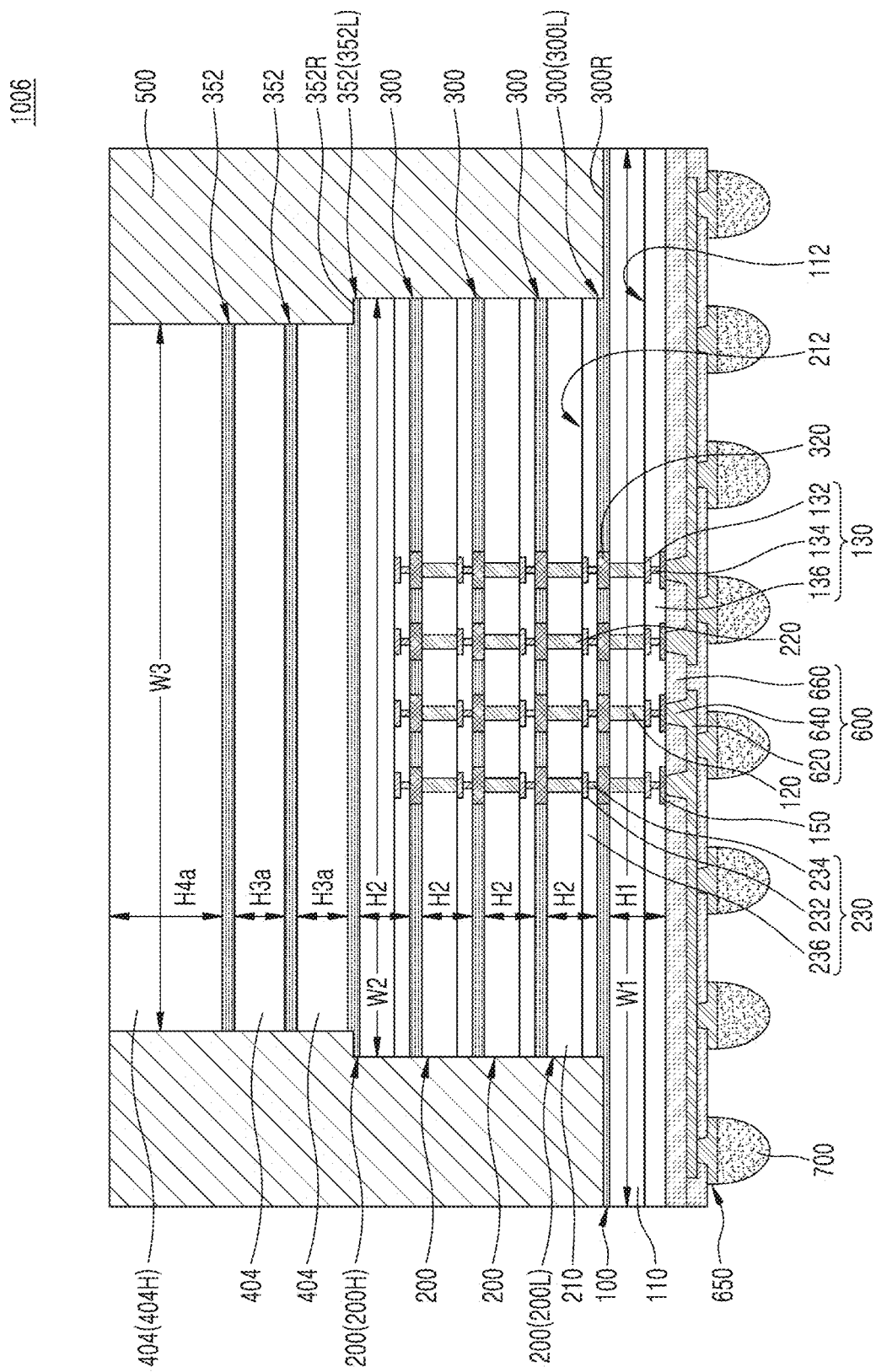

Referring to FIG. 4A, the semiconductor package 1006 includes a first semiconductor chip 100 and a plurality of second semiconductor chips 200. The first semiconductor chip 100 and the plurality of second semiconductor chips 200 included in the semiconductor package 1006 may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 404 may be stacked on the uppermost second semiconductor chip 200H. The plurality of supporting dummy substrates 404 may include, for example, a semiconductor material such as silicon. In some embodiments, the plurality of supporting dummy substrates 404 may be made of only semiconductor material. For example, each of the plurality of supporting dummy substrates 404 may be a part of a bare wafer. Among the plurality of supporting dummy substrates 404, the uppermost supporting dummy substrate 404 may be referred to as the uppermost supporting dummy substrate 404H. The total vertical height of the stacked plurality of supporting dummy substrates 404 may be greater than the second vertical height H2. For example, the vertical height of the entire stacked plurality of supporting dummy substrates 404 may be about 100 μm to about 500 μm.

Among the plurality of supporting dummy substrates 404, the remaining supporting dummy substrate 404 except for the uppermost supporting dummy substrate 404H may have a third horizontal width W3 and a third vertical height H3a. The uppermost supporting dummy substrate 404H may have a third horizontal width W3 and a fourth vertical height H4a. The fourth vertical height H4a may have a greater value than the third vertical height H3a. For example, the fourth vertical height H4a may be greater than that of the third vertical height H3a by several tens of μm to several hundred μm.

A support bonding insulating layer 352 may be arranged between the uppermost second semiconductor chip 200H and the plurality of supporting dummy substrates 404, that is, between the uppermost second semiconductor chip 200H and the lowermost supporting dummy substrate 404, and between the plurality of supporting dummy substrates 404, respectively.

Figure 4B:
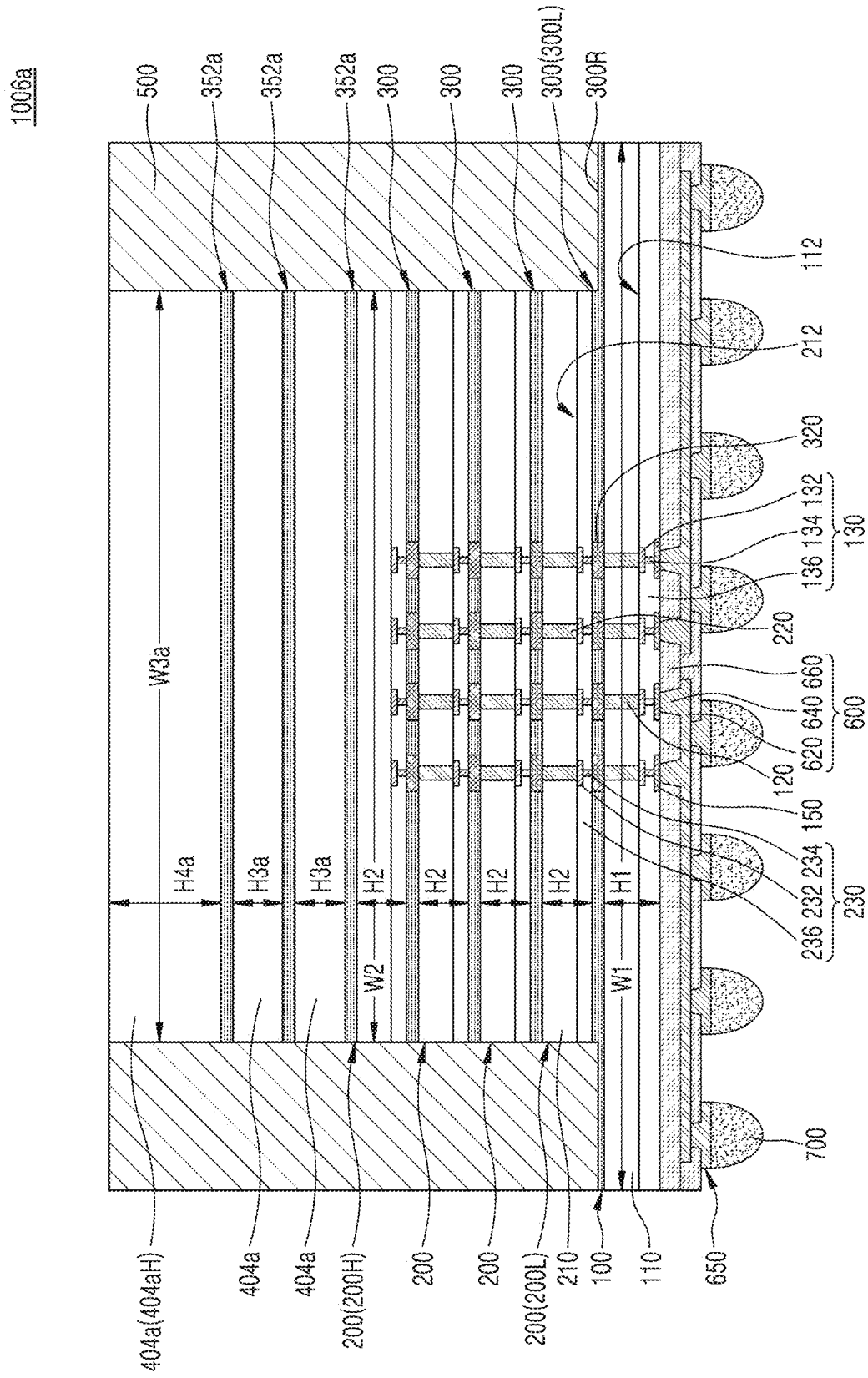

Referring to FIG. 4B, a semiconductor package 1006a includes a first semiconductor chip 100 and a plurality of second semiconductor chips 200. The first semiconductor chip 100 and the plurality of second semiconductor chips 200 included in the semiconductor package 1006a may be electrically connected through a plurality of bonding pads 320 to exchange signals and provide power and a ground.

The first semiconductor chip 100 may have a first horizontal width W1 and a first vertical height H1, and each of the plurality of second semiconductor chips 200 may have a second horizontal width W2 and a second vertical height H2.

A plurality of supporting dummy substrates 404a may be stacked on the uppermost second semiconductor chip 200H. The plurality of supporting dummy substrates 404a may include, for example, a semiconductor material such as silicon. In some embodiments, the plurality of supporting dummy substrates 404a may be made of only semiconductor material. For example, each of the plurality of supporting dummy substrates 404a may be a part of a bare wafer. Among the plurality of supporting dummy substrates 404a, the uppermost supporting dummy substrate 404a may be referred to as the uppermost supporting dummy substrate 404aH.

Among the plurality of supporting dummy substrates 404a, the remaining supporting dummy substrate 404a except for the uppermost supporting dummy substrate 404aH may have a third horizontal width W3a and a third vertical height H3a. The uppermost supporting dummy substrate 404aH may have a third horizontal width W3a and a fourth vertical height H4a. The fourth vertical height H4a may have a greater value than the third vertical height H3a. For example, the fourth vertical height H4a may be greater than that of the third vertical height H3a by several tens of μm to several hundred μm.

A support bonding insulating layer 352a may be arranged between the uppermost second semiconductor chip 200H and the plurality of supporting dummy substrates 404a, that is, between the uppermost second semiconductor chip 200H and the lowermost supporting dummy substrate 404a, and between the plurality of supporting dummy substrates 404a, respectively.

FIGS. 5A to 5I are cross-sectional views illustrating a method of manufacturing a semiconductor package, according to example embodiments. In particular, FIGS. 5A to 5I are cross-sectional views illustrating a method of manufacturing the semiconductor package 1000 shown in FIG. 1A, and descriptions that are the same as those of FIG. 1A may be omitted.

Figure 5A:
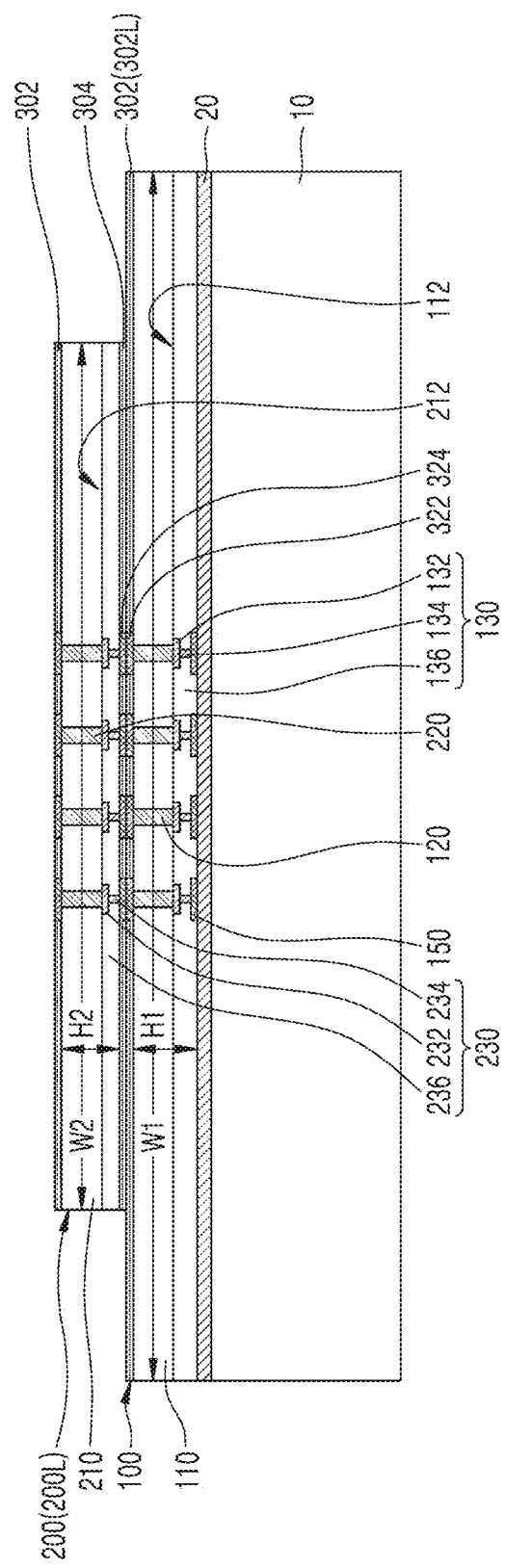

Referring to FIG. 5A, a plurality of first chip connection pads 322 and a first chip bonding insulating material layer 302 are formed on the upper surface of the first semiconductor chip 100. The plurality of first chip connection pads 322 may be arranged on an upper surface of the first semiconductor chip 100, that is, an inactive surface. The plurality of first chip connection pads 322 may be arranged on the upper surface of the first semiconductor chip 100 to be connected to the plurality of first through electrodes 120. The first chip bonding insulating material layer 302 may be formed to surround the side surfaces of the plurality of first chip connection pads 322 on the upper surface of the first semiconductor chip 100, that is, the inactive surface. The first chip bonding insulating material layer 302 may cover the upper surface of the first semiconductor chip 100 and the side surfaces of the plurality of first chip connection pads 322, and may expose the upper surfaces of the plurality of first chip connection pads 322 without covering them.

A first semiconductor chip 100 having a plurality of first chip connection pads 322 and a first chip bonding insulating material layer 302 formed thereon is attached on the first support substrate 10. The first semiconductor chip 100 may be attached on a first release film 20 after the first release film 20 is attached to the upper surface of the first support substrate 10. The first semiconductor chip 100 may be attached on the first release film 20 such that the first wiring structure 130 faces the first support substrate 10.

A plurality of first chip connection pads 322 and a first chip bonding insulating material layer 302 are also formed on the upper surface of the second semiconductor chip 200. The plurality of first chip connection pads 322 may be arranged on an upper surface of the second semiconductor chip 100, that is, an inactive surface. The plurality of first chip connection pads 322 may be arranged on the upper surface of the second semiconductor chip 200 to be connected to the plurality of second through electrodes 120. The first chip bonding insulating material layer 302 may be formed to surround the side surfaces of the plurality of first chip connection pads 322 on the upper surface of the second semiconductor chip 200, that is, the inactive surface. The first chip bonding insulating material layer 302 may cover the upper surface of the second semiconductor chip 200 and the side surfaces of the plurality of first chip connection pads 322, and may expose the upper surfaces of the plurality of first chip connection pads 322 without covering them.

A plurality of second chip connection pads 324 and a second chip bonding insulating material layer 304 are formed on the lower surface of the second semiconductor chip 200. The plurality of second chip connection pads 324 may be arranged on the lower surface of the second semiconductor chip 200, that is, the lower surface of the second wiring structure 230. The plurality of second chip connection pads 324 may be arranged on a lower surface of the second semiconductor chip 200 to be connected to the second wiring pattern 232 and/or the second wiring via 234. The second chip bonding insulating material layer 304 may be formed to surround side surfaces of the plurality of second chip connection pads 324 on the lower surface of the second semiconductor chip 200. The second chip bonding insulating material layer 304 may cover the lower surface of the second semiconductor chip 200 and the side surfaces of the plurality of second chip connection pads 324, and may expose the lower surfaces of the plurality of second chip connection pads 324 without covering them.

The second semiconductor chip 200 is positioned on the first semiconductor chip 100. The second semiconductor chip 200 may be the lowermost second semiconductor chip 200L shown in FIG. 1A. The lowermost second semiconductor chip 200L may be positioned on the first semiconductor chip 100 such that the second wiring structure 230 faces the first semiconductor chip 100. The lowermost second semiconductor chip 200L may be positioned on the first semiconductor chip 100, so that the plurality of second chip connection pads 324 formed on the lower surface of the lowermost second semiconductor chip 200L correspond to the plurality of first chip connection pads 322 formed on the upper surface of the first semiconductor chip 100.

Figure 5B:
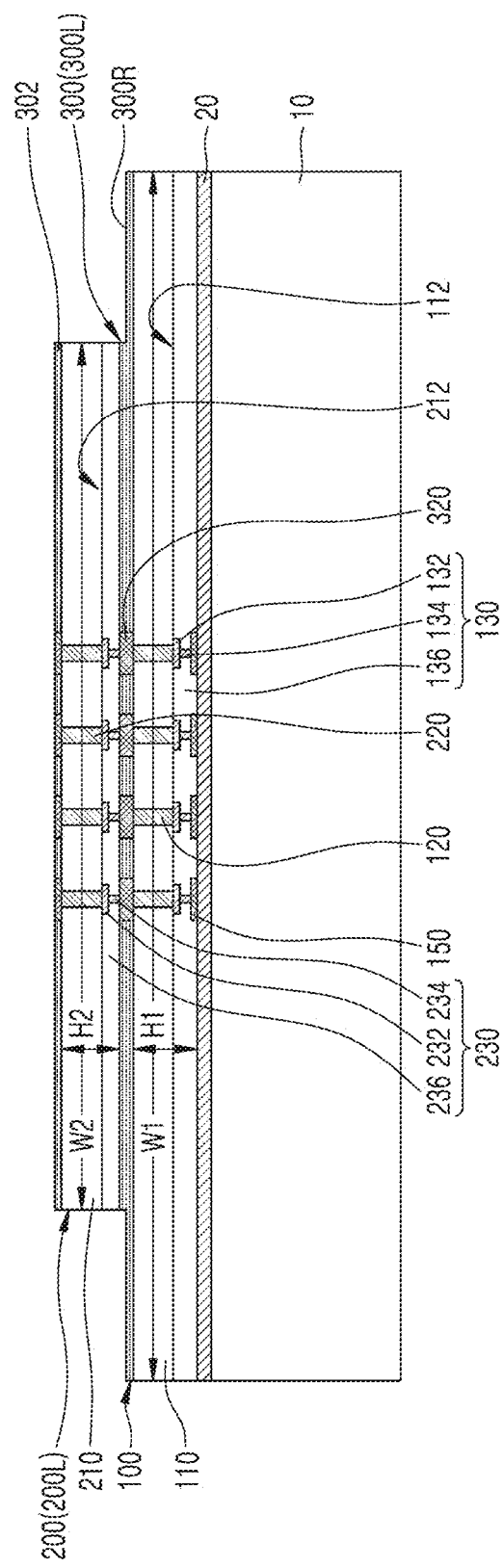

Referring to FIGS. 5A and 5B, in the process of locating the lowermost second semiconductor chip 200L on the first semiconductor chip 100, by applying heat and/or pressure, the plurality of first chip connection pads 322 and the plurality of second chip connection pads 324 may be bonded and the first chip bonding insulating material layer 302 and the second chip bonding insulating material layer 304 may be bonded. In some embodiments, the plurality of first chip connection pads 322 and the plurality of second chip connection pads 324, and the first chip bonding insulating material layer 302 and the second chip bonding insulating material layer 304 may be covalently bonded to each other. For example, heat of a first temperature may be applied while the second semiconductor chip 200 is placed on the first semiconductor chip 100.

Then, by applying heat of a second temperature higher than the first temperature, a plurality of bonding pads 320 in which a plurality of first chip connection pads 322 and a plurality of second chip connection pads 324 corresponding to each other are coupled to each other, and a chip bonding insulating layer 300 in which the first chip bonding insulating material layer 302 and the second chip bonding insulating material layer 304 are combined are formed. After a plurality of first chip connection pads 322 and a plurality of second chip connection pads 324 corresponding to each other expand by heat to contact each other, a plurality of diffusion-bonded bonding pads 320 may be provided to form an integral body through diffusion of the metal atoms included therein.

Figure 5C:
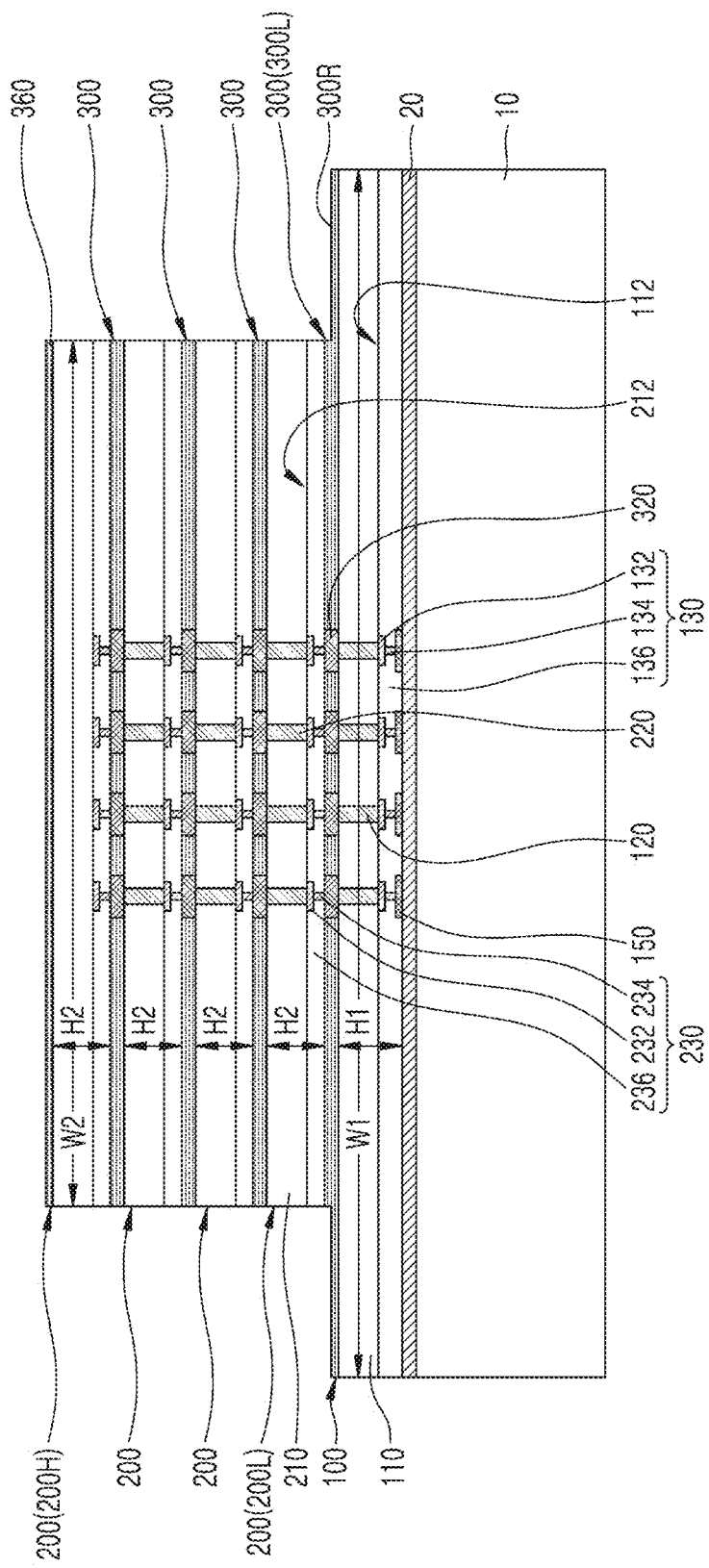

Referring to FIG. 5C, a plurality of second semiconductor chips 200 are sequentially positioned on the lowermost second semiconductor chip 200L. A plurality of second chip connection pads 324 and a second chip bonding insulating material layer 304 are formed on the lower surface of the plurality of second semiconductor chips 200 sequentially positioned on the lowermost second semiconductor chip 200L, and except for the uppermost second semiconductor chip 200H among the plurality of second semiconductor chips 200, a plurality of first chip connection pads 322 and a first chip bonding insulating material layer 302 may be formed on the upper surface of the remaining second semiconductor chip 200. A first support bonding insulating material layer 360 may be formed on the upper surface of the uppermost second semiconductor chip 200H.

Thereafter, through a method similar to that described in FIG. 5B, a plurality of bonding pads 320 in which a plurality of first chip connection pads 322 and a plurality of second chip connection pads 324 corresponding to each other are bonded to each other between the plurality of second semiconductor chips 200, and a chip bonding insulating layer 300 in which the first chip bonding insulating material layer 302 and the second chip bonding insulating material layer 304 are bonded are formed so that the plurality of second semiconductor chips 200 may be sequentially attached to the first semiconductor chip 100.

Figure 5D:
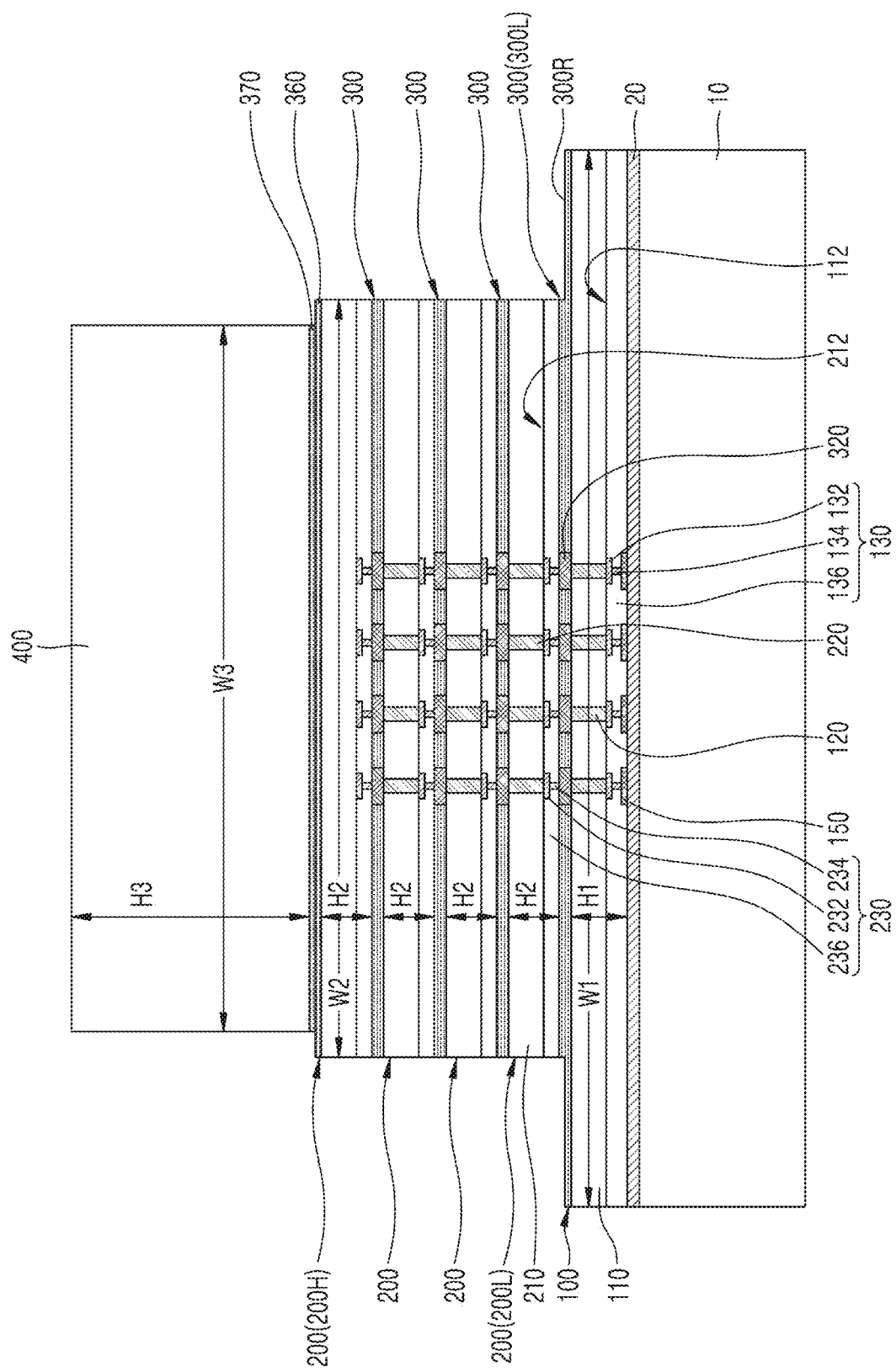

Referring to FIG. 5D, after forming the second support bonding insulating material layer 370 on the lower surface of the supporting dummy substrate 400, a supporting dummy substrate 400 is positioned on the uppermost second semiconductor chip 200H.

The plurality of second semiconductor chips 200 may have a second horizontal width W2, and the supporting dummy substrate 400 may have a third horizontal width W3 smaller than the second horizontal width W2. In some embodiments, the third horizontal width W3 may be smaller than the second horizontal width W2 by several μm to several hundreds of μm.

The supporting dummy substrate 400 may be positioned on the uppermost second semiconductor chip 200H by using an edge of the uppermost second semiconductor chip 200H as an align key.

Referring to FIG. 5E, through a method similar to that described with reference to FIG. 5B, a support bonding insulating layer 350 in which the first support bonding insulating material layer 360 and the second support bonding insulating material layer 370 are bonded is formed between the uppermost second semiconductor chip 200H and the supporting dummy substrate 400, so that the supporting dummy substrate 400 may be attached on the uppermost second semiconductor chip 200H.

Figure 5F:
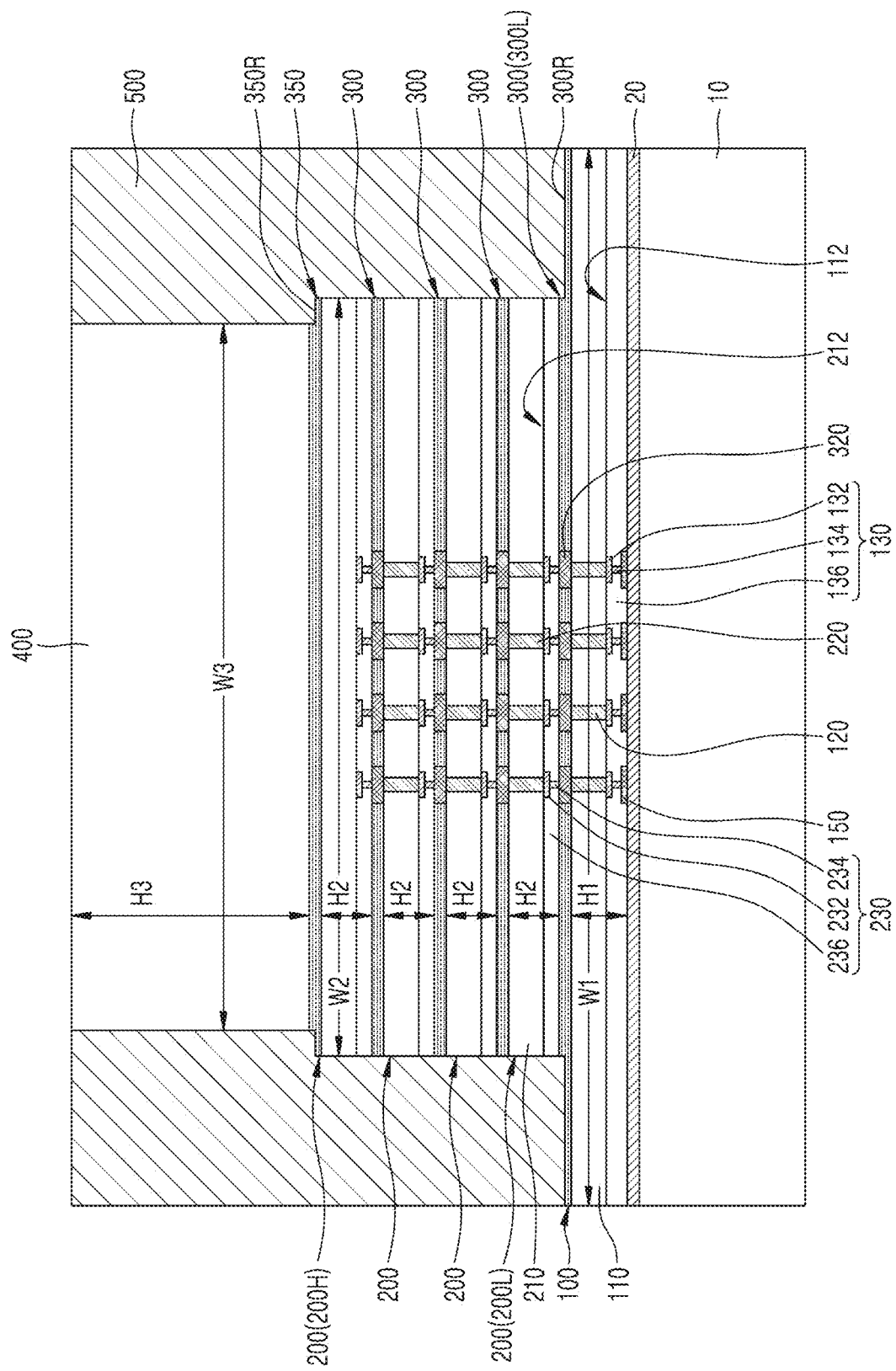

Referring to FIG. 5F, the package molding layer 500 covering the upper surface of the first semiconductor chip 100 and surrounding the side surfaces of the plurality of second semiconductor chips 200 and the supporting dummy substrate 400 may be formed on the first semiconductor chip 100.

After the package molding layer 500 is formed, the first support substrate 10 to which the first release film 20 is attached may be separated from the first semiconductor chip 100.

Figure 5G:
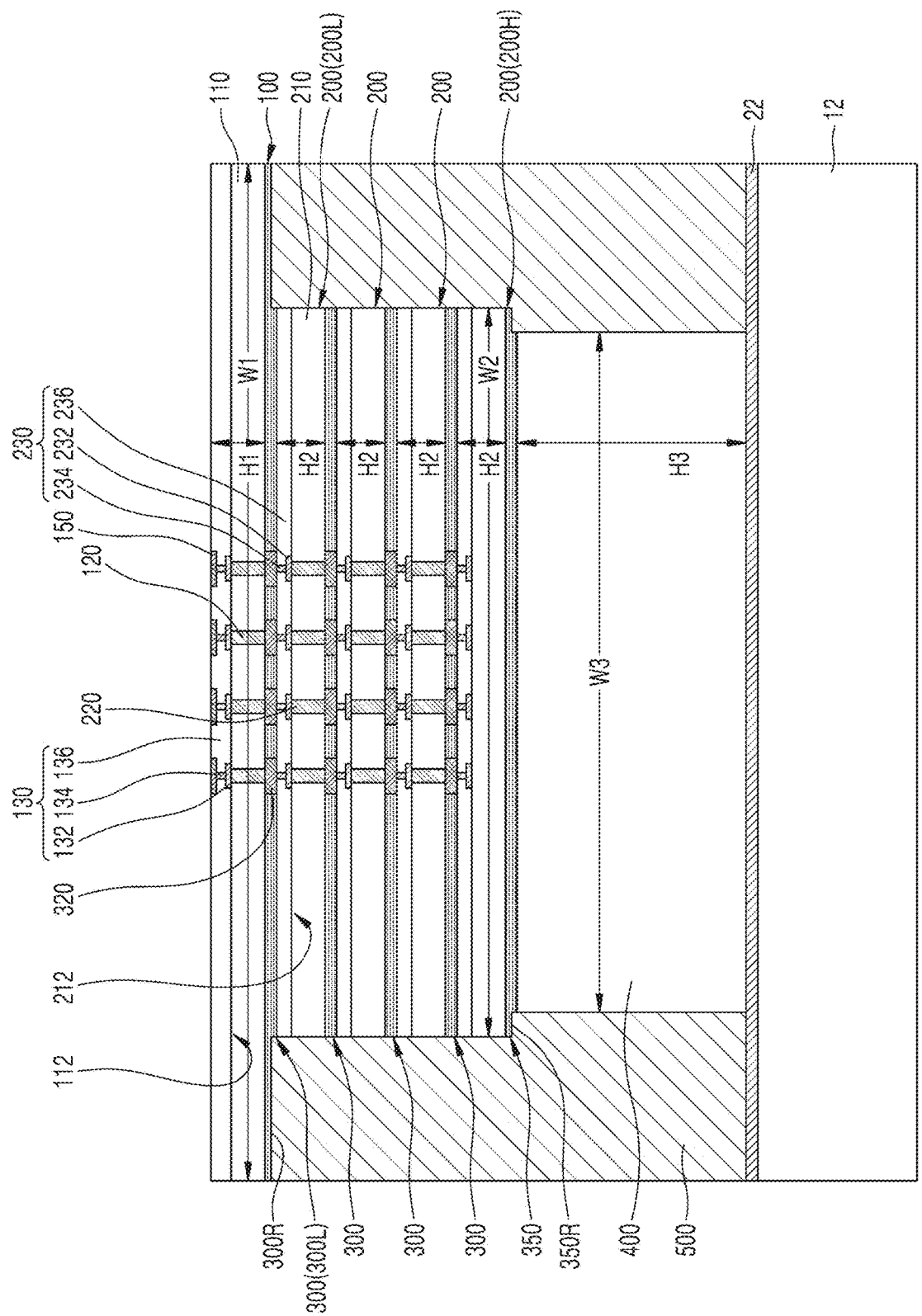

Referring to FIG. 5G, the result of FIG. 5F is turned over and attached to the second support substrate 12. After the second release film 22 is attached to the upper surface of the second supporting substrate 12, the upside down result of FIG. 5F may be attached to the second release film 22. The supporting dummy substrate 400 and the package molding layer 500 may be in contact with the second release film 22.

Figure 5H:
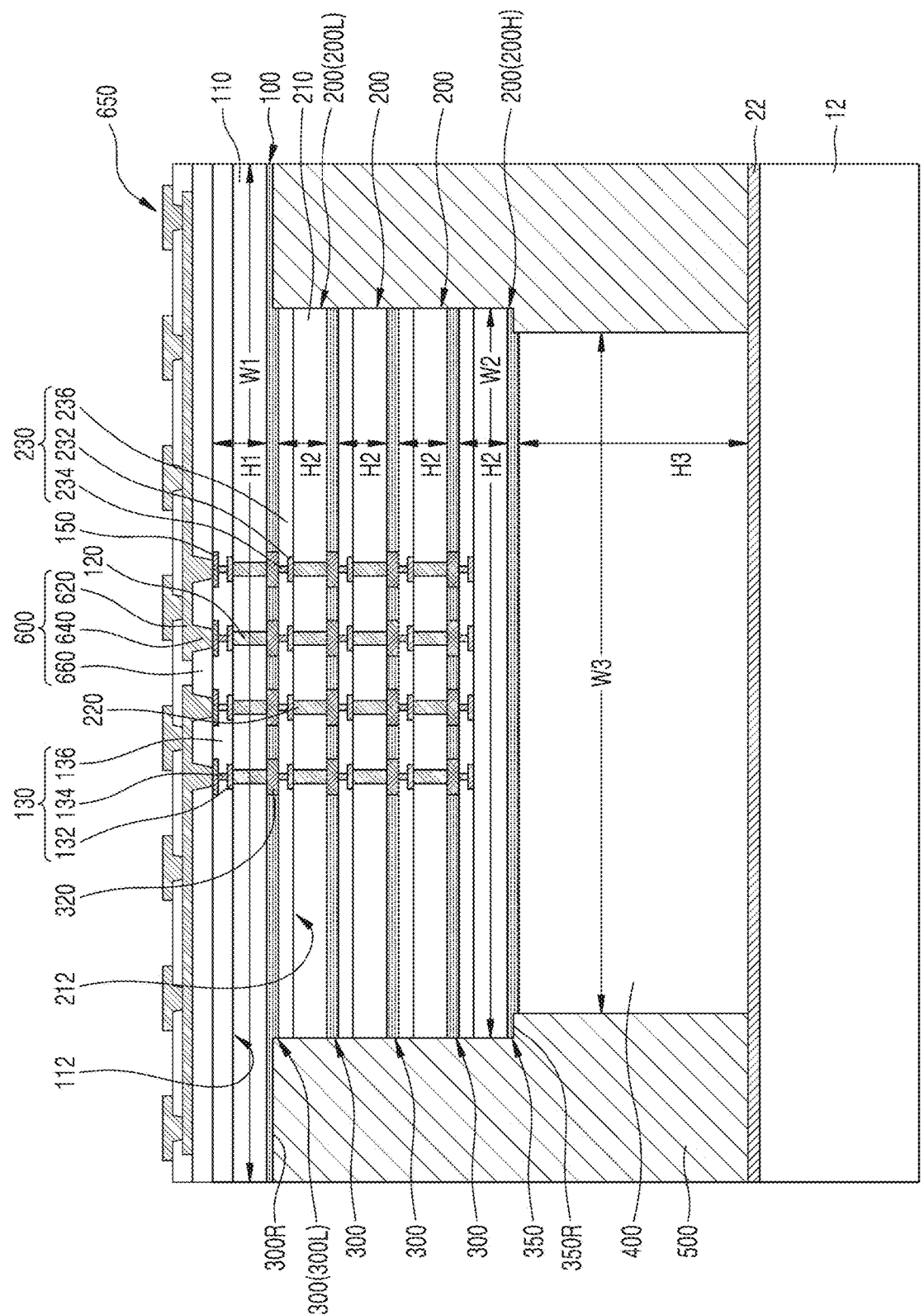

Referring to FIG. 5H, a base rewiring layer 600 is formed on the first wiring structure 130 of the first semiconductor chip 100. The base rewiring layer 600 may be formed to include a plurality of package rewiring line patterns 620, a plurality of package rewiring vias 640, and a package rewiring insulating layer 660. At least a portion of the plurality of package rewiring vias 640 or at least a portion of the plurality of package rewiring line patterns 620 may be formed to contact the plurality of chip pads 150. Among the plurality of package rewiring line patterns 620, the package rewiring line pattern 620 arranged on the upper surface of the package rewiring layer 600 may be referred to as a package pad 650.

In some embodiments, the plurality of package rewiring vias 640 may be formed to have a tapered shape extending horizontally from the lower side to the upper side. That is, the plurality of package rewiring vias 640 may be formed to widen horizontally away from the first semiconductor chip 100.

Figure 5I:
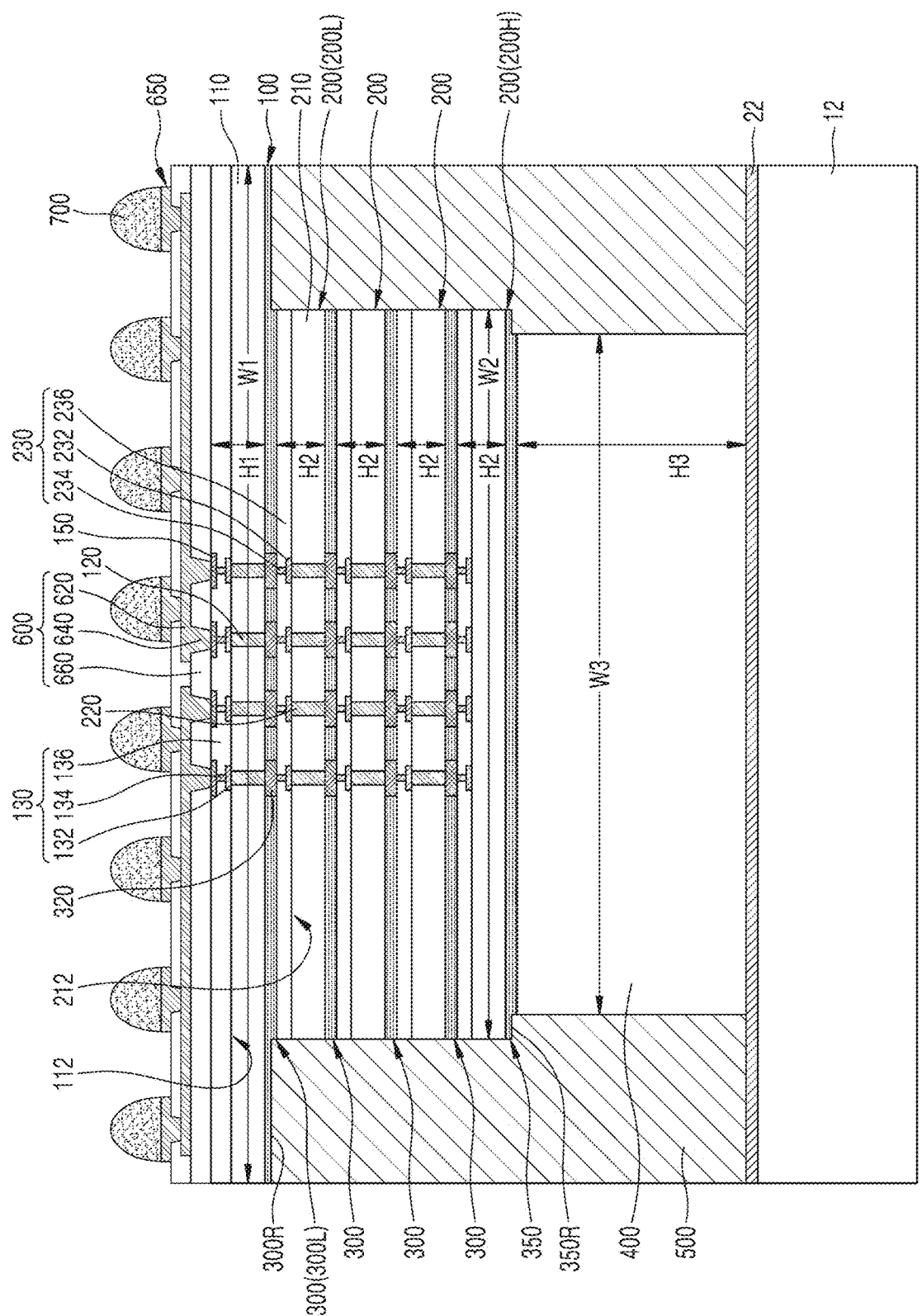

Referring to FIG. 5I, a plurality of package connection terminals 700 are attached to a plurality of package pads 650.

Then, after separating the second support substrate 12 to which the second release film 22 is attached from the supporting dummy substrate 400 and the package molding layer 500, the resultant product may be turned over to form the semiconductor package 1000 shown in FIG. 1A.

Figure 6B:
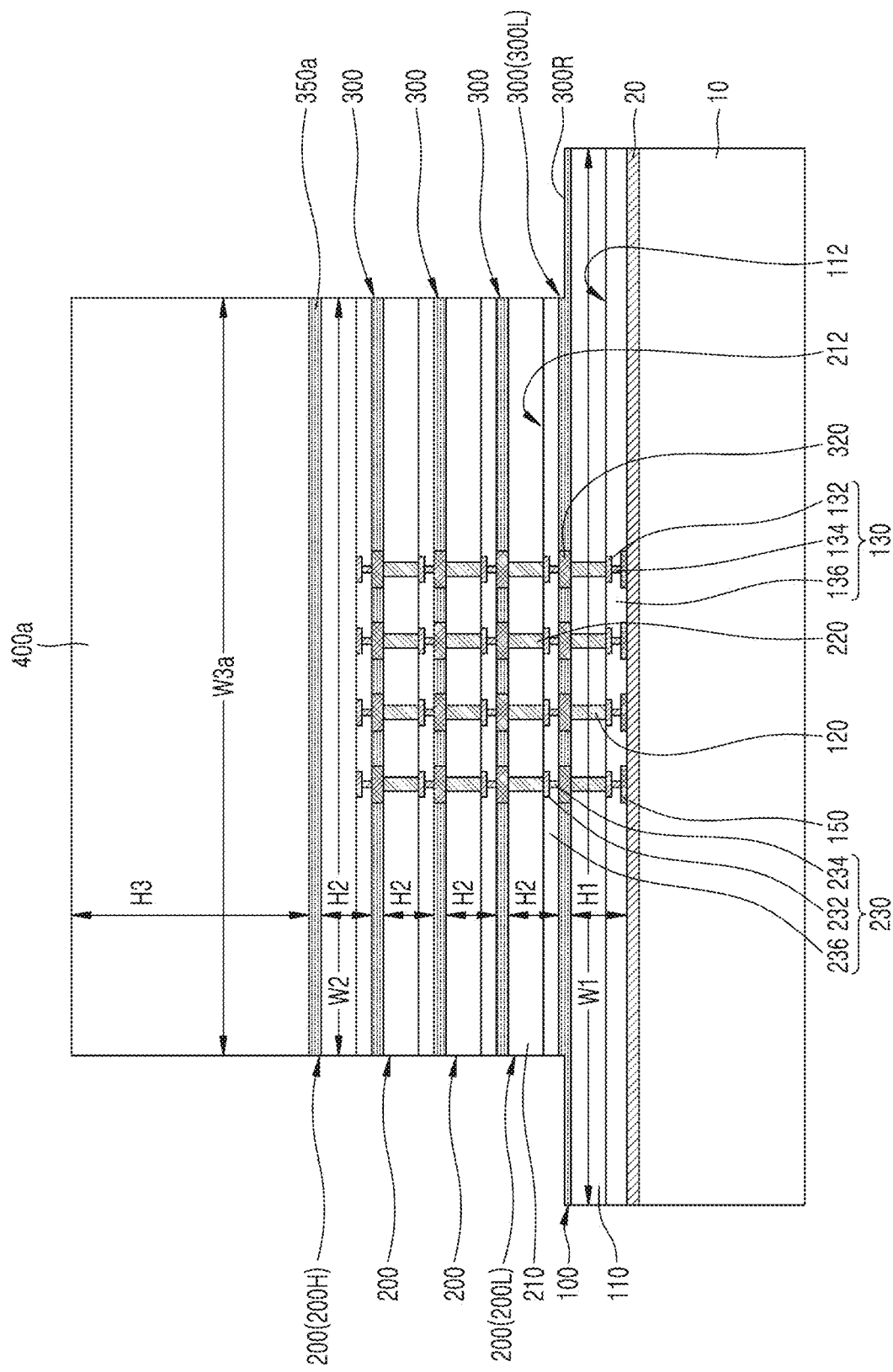

FIGS. 6A to 6B are cross-sectional views illustrating a method of manufacturing a semiconductor package, according to example embodiments. In particular, FIGS. 6A and 6B are cross-sectional views illustrating a method of manufacturing the semiconductor package 1000a shown in FIG. 1B, and the descriptions that are the same as those of FIG. 1B may be omitted.

Referring to FIG. 6A, after forming a second support bonding insulating material layer 370a on the lower surface of the supporting dummy substrate 400a, a supporting dummy substrate 400a is positioned on the uppermost second semiconductor chip 200H of the result shown in FIG. 5C.

The plurality of second semiconductor chips 200 may have a second horizontal width W2, and the supporting dummy substrate 400a may have a third horizontal width W3a. In some embodiments, the third horizontal width W3a and the second horizontal width W2 may have substantially a same value.

The supporting dummy substrate 400a may be positioned on the uppermost second semiconductor chip 200H, so that the edge of the supporting dummy substrate 400a and the edge of the uppermost second semiconductor chip 200H are aligned with each other.

Referring to FIG. 6B, through a method similar to that described with reference to FIG. 5B, a support bonding insulating layer 350a in which the first support bonding insulating material layer 360 and the second support bonding insulating material layer 370a are bonded is formed between the uppermost second semiconductor chip 200H and the supporting dummy substrate 400a, so that the supporting dummy substrate 400a may be attached on the uppermost second semiconductor chip 200H.

Thereafter, the semiconductor package 1000a shown in FIG. 1B may be formed with reference to the method described with reference to FIGS. 5F to 5I.

FIGS. 7A to 7D are cross-sectional views illustrating a method of manufacturing a semiconductor package, according to example embodiments. In particular, FIGS. 7A to 7D are cross-sectional views illustrating a method of manufacturing the semiconductor package 1002 shown in FIG. 2A, and descriptions that are the same as those of FIG. 2A may be omitted.

Figure 7A:
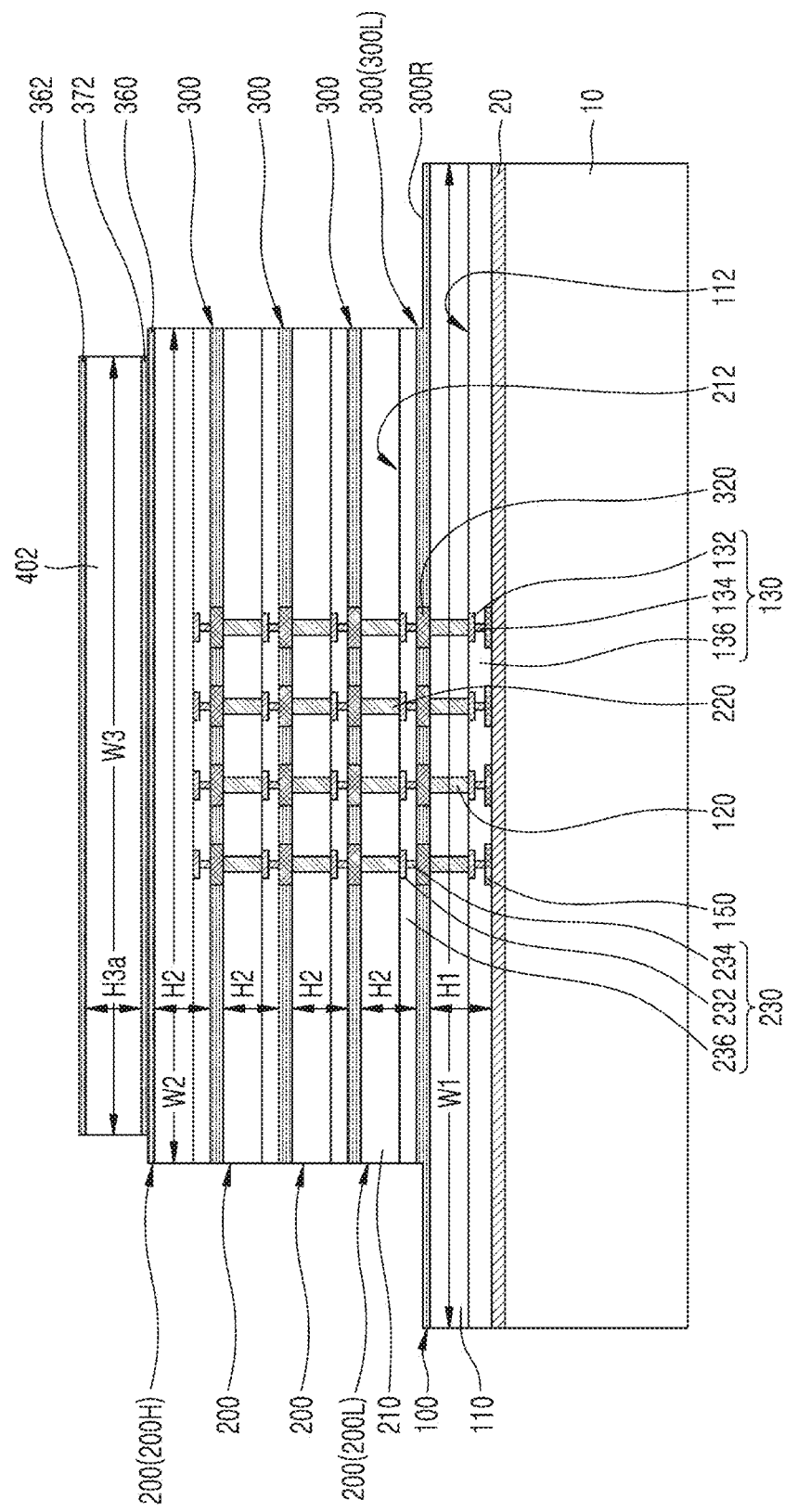
FIGS. 7A to 7D are cross-sectional views illustrating a method of manufacturing a semiconductor package, according to example embodiments.

Referring to FIG. 7A, after forming a second support bonding insulating material layer 372 on the lower surface of the supporting dummy substrate 402, and forming a third support bonding insulating material layer 362 on the upper surface, a supporting dummy substrate 402 is positioned on the uppermost second semiconductor chip 200H of the result shown in FIG. 5C.

The plurality of second semiconductor chips 200 may have a second horizontal width W2 and a second vertical height H2, and the supporting dummy substrate 402 may have a third horizontal width W3 and a third vertical height H3a. In some embodiments, the third horizontal width W3 may have a smaller value than the first horizontal width W1 and the second horizontal width W2. In some embodiments, the third vertical height H3a may have substantially the same value as the first vertical height H1 and the second vertical height H2. The supporting dummy substrate 402 may be positioned on the uppermost second semiconductor chip 200H by using the edge of the uppermost second semiconductor chip 200H as an align key.

Figure 7B:
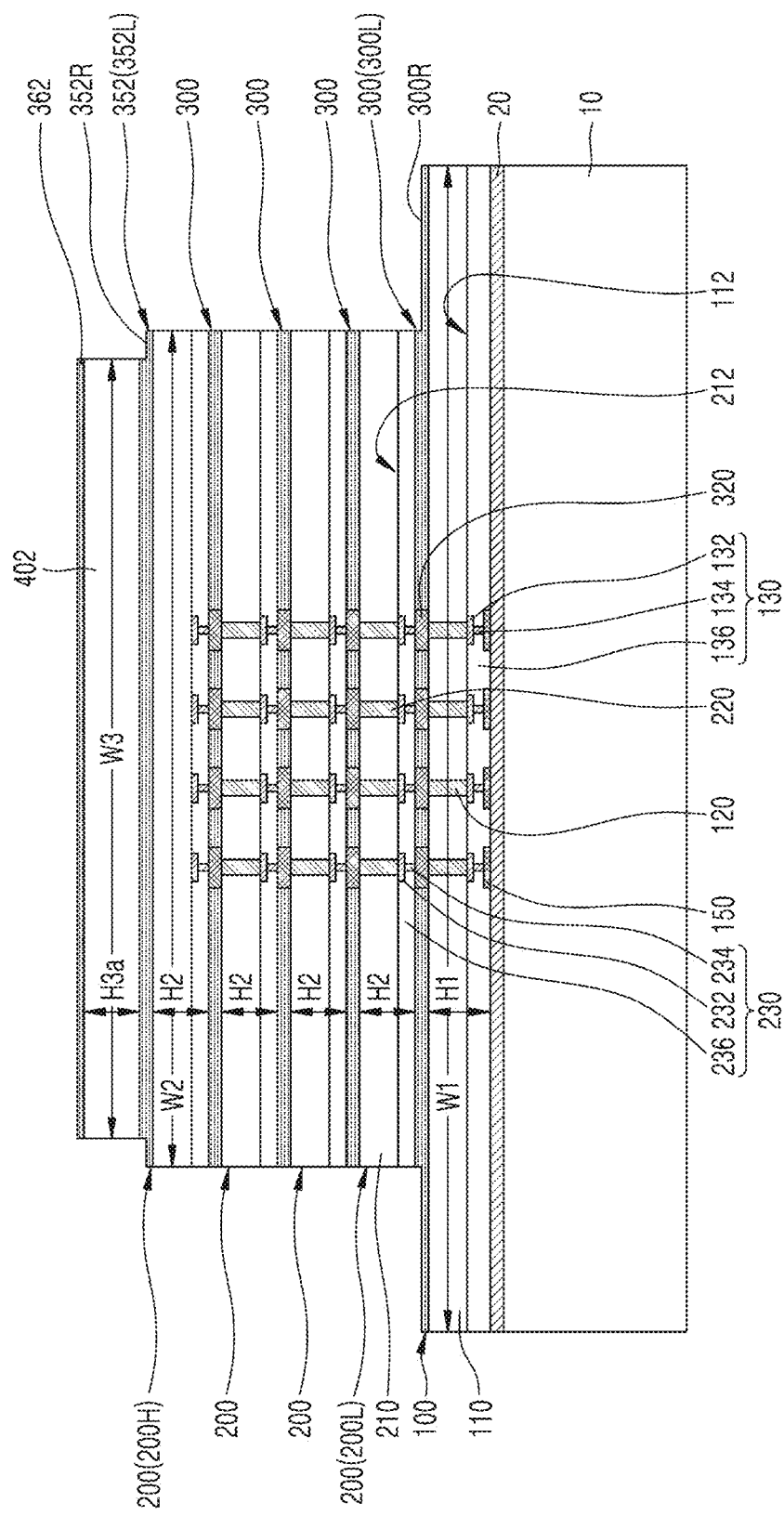

Referring to FIG. 7B, through a method similar to that described with reference to FIG. 5B, the lowermost support bonding insulating layer 352L in which the first support bonding insulating material layer 360 and the second support bonding insulating material layer 372 are bonded is formed between the uppermost second semiconductor chip 200H and the supporting dummy substrate 402, so that the supporting dummy substrate 402 may be attached on the uppermost second semiconductor chip 200H.

Figure 7C:
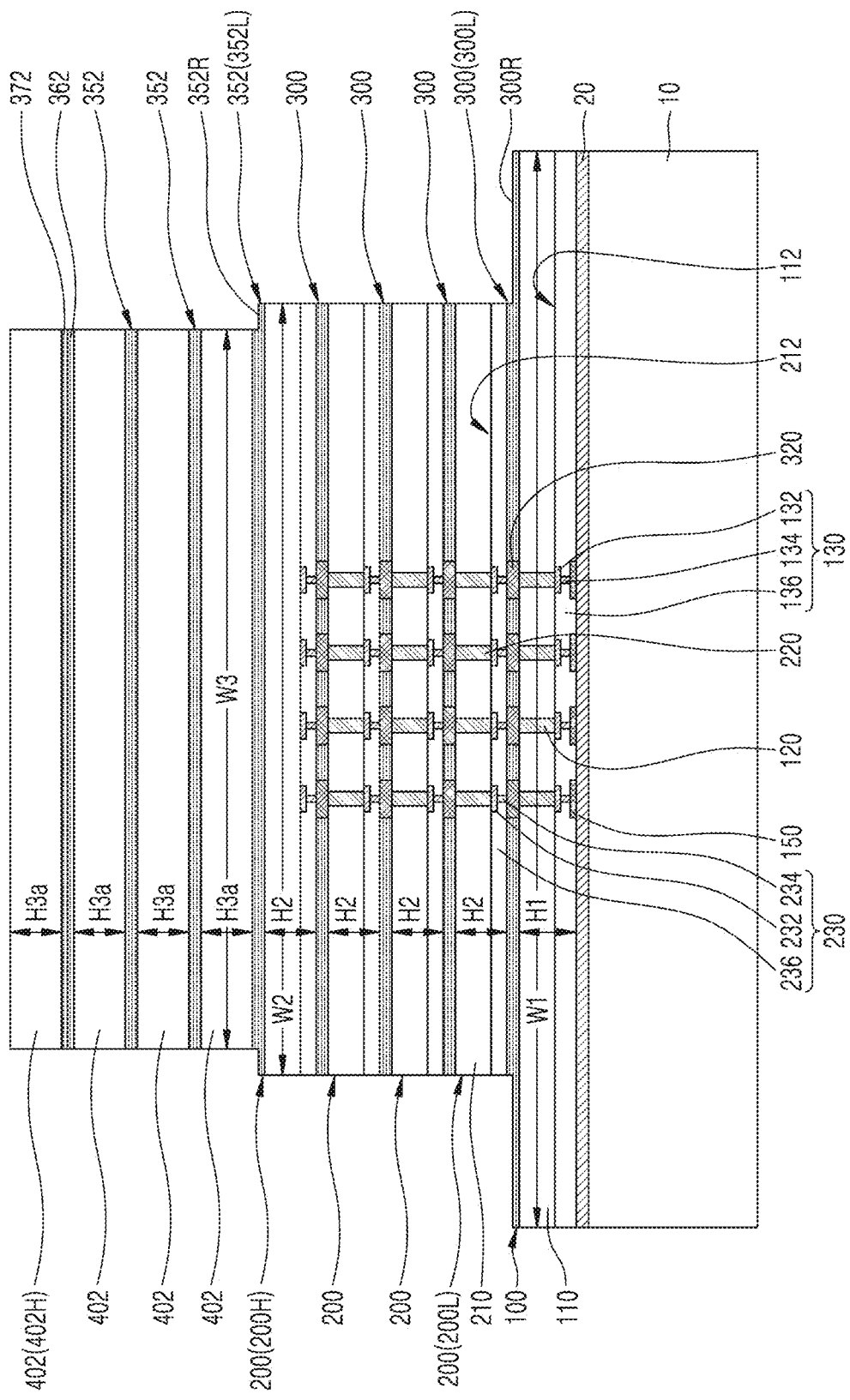
Figure 7D:
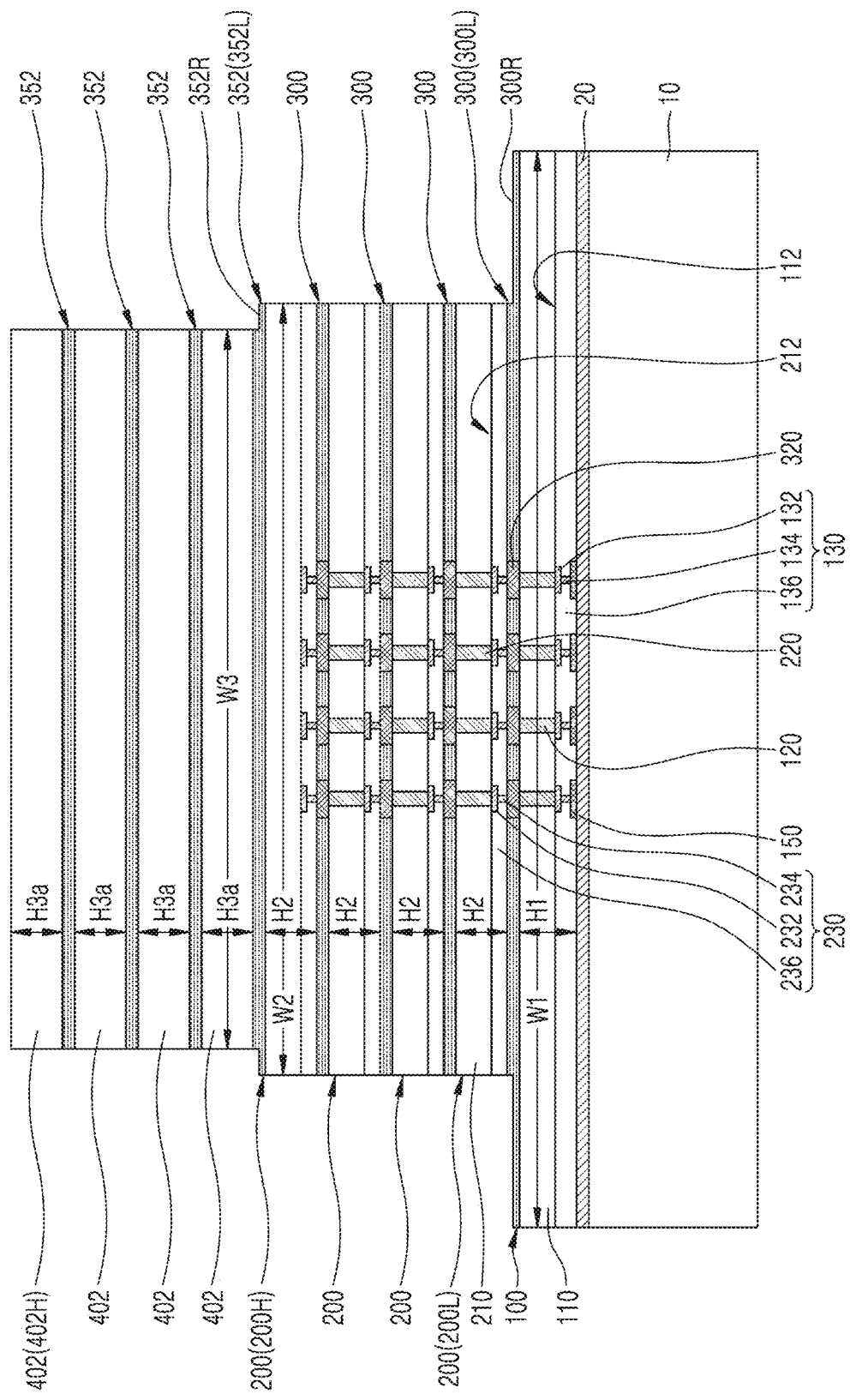

Referring to FIGS. 7C and 7D together, by further positioning another supporting dummy substrate 402 on the supporting dummy substrate 402, the plurality of supporting dummy substrates 402 may be stacked on the uppermost second semiconductor chip 200H. A second support bonding insulating material layer 372 may be formed on a lower surface of the plurality of supporting dummy substrates 402. A third support bonding insulating material layer 362 may be formed on the upper surface of the remaining supporting dummy substrate 402 except for the uppermost supporting dummy substrate 402H among the plurality of supporting dummy substrates 402.

Through a method similar to that described with reference to FIG. 5B, a plurality of support bonding insulating layers 352 in which the third support bonding insulating material layer 362 and the second support bonding insulating material layer 372 formed on the upper and lower surfaces of the supporting dummy substrate 402 facing each other are bonded are formed, so that a plurality of supporting dummy substrates 402 may be attached on the uppermost second semiconductor chip 200H.

Thereafter, the semiconductor package 1002 shown in FIG. 2A may be formed with reference to the method described with reference to FIGS. 5F to 5I.

The semiconductor package 1002a shown in FIG. 2B may be formed with reference to FIGS. 6A and 6B and FIGS. 7A to 7D.

Figure 8A:
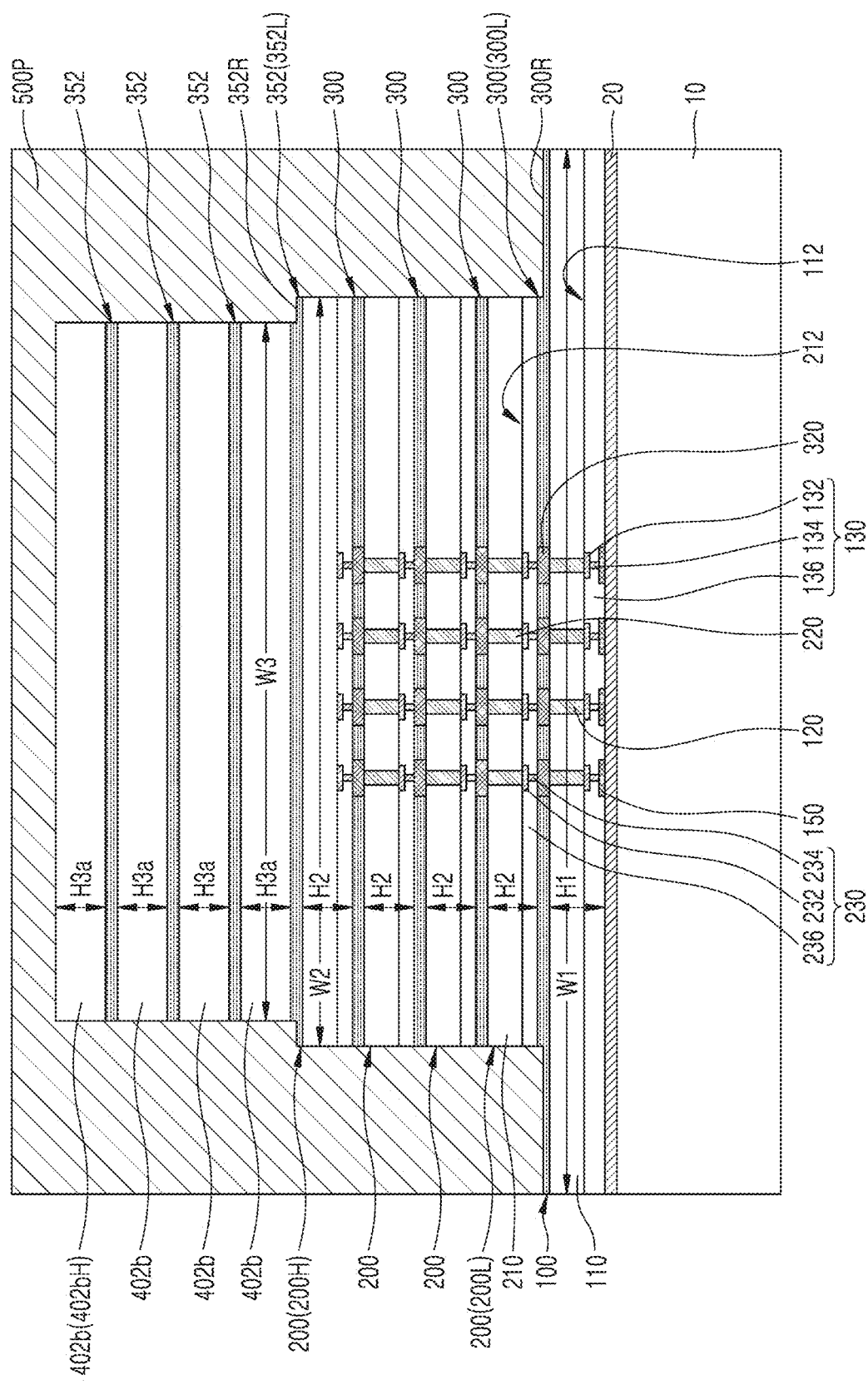
FIGS. 8A and 8B are cross-sectional views illustrating a method of manufacturing a semiconductor package, according to example embodiments.
Figure 8B:
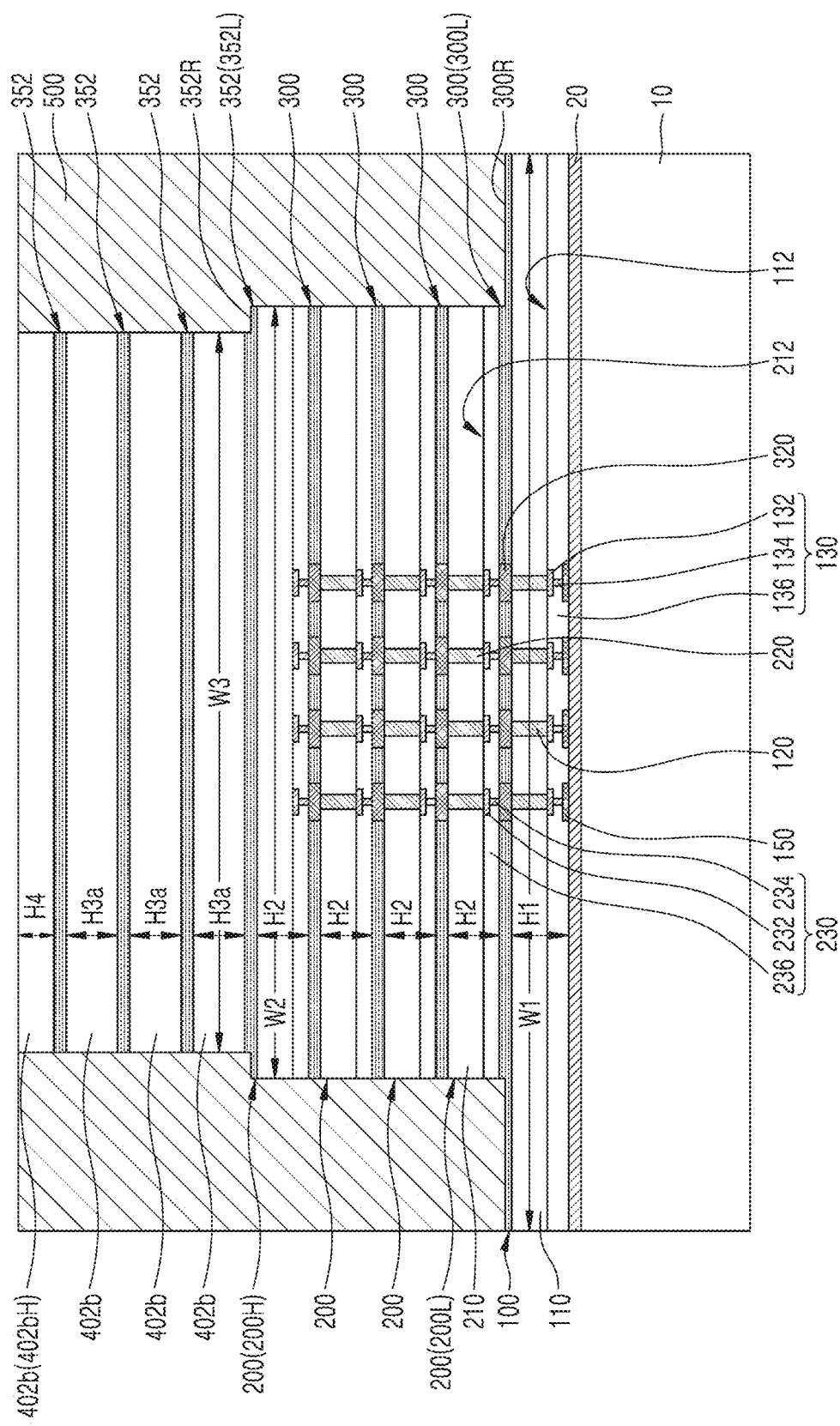

FIGS. 8A and 8B are cross-sectional views illustrating a method of manufacturing a semiconductor package, according to example embodiments. In particular, FIGS. 8A to 8D are cross-sectional views illustrating a method of manufacturing the semiconductor package 1004 shown in FIG. 3A, and descriptions that are the same as those of FIG. 3A may be omitted.

Referring to FIG. 8A, referring to the method described with reference to FIGS. 7A to 7D, a plurality of supporting dummy substrates 402b may be attached to the uppermost second semiconductor chip 200H. The plurality of supporting dummy substrates 402b shown in FIG. 8A may be substantially the same as the plurality of supporting dummy substrates 402b shown in FIG. 7D.

Thereafter, a preliminary package molding layer 500P covering the upper surface of the first semiconductor chip 100 and surrounding the side surfaces of the plurality of second semiconductor chips 200 and the side and upper surfaces of the supporting dummy substrate 400b may be formed on the first semiconductor chip 100.

Referring to FIGS. 8A and 8B together, the upper portion of the preliminary package molding layer 500P is removed to form the package molding layer 500. The package molding layer 500 may be formed by removing an upper portion of the preliminary package molding layer 500P through a grinding process.

In some embodiments, during the grinding process of forming the package molding layer 500, an upper portion of the uppermost supporting dummy substrate 402bH may also be removed. Therefore, the fourth vertical height H4, which is the thickness of the uppermost supporting dummy substrate 402bH among the plurality of supporting dummy substrates 402b, may be less than the third vertical height H3a, which is the thickness of the remaining supporting dummy substrate 402b.

Thereafter, the semiconductor package 1004 shown in FIG. 3A may be formed with reference to the method described with reference to FIGS. 5G to 5I.

The semiconductor package 1004a shown in FIG. 3B may be formed with reference to FIGS. 6A and 6B and FIGS. 8A and 8B.

The semiconductor package 1006 shown in FIG. 4A refers to FIGS. 7A to 7D, and the fourth vertical height H4a, which is the thickness of the uppermost supporting dummy substrate 404H among the plurality of supporting dummy substrates 404 may be formed by making it smaller than the third vertical height H3a, which is the thickness of the remaining supporting dummy substrate 404, and the semiconductor package 1006a shown in FIG. 4B may be formed with reference to FIGS. 6A and 6B together.

Figure 9:
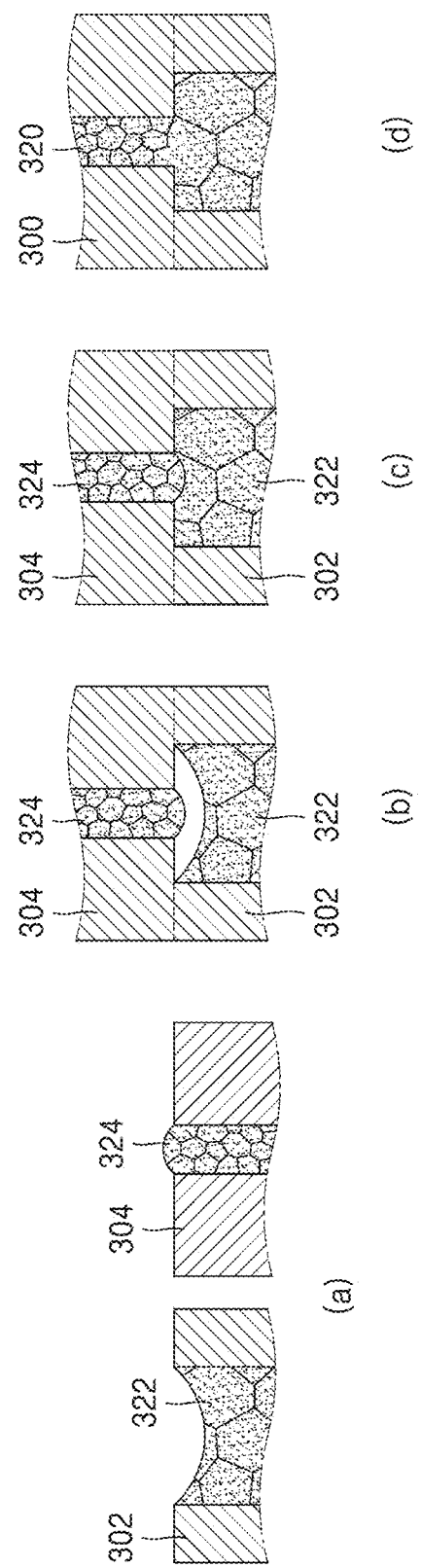
Figure 10:
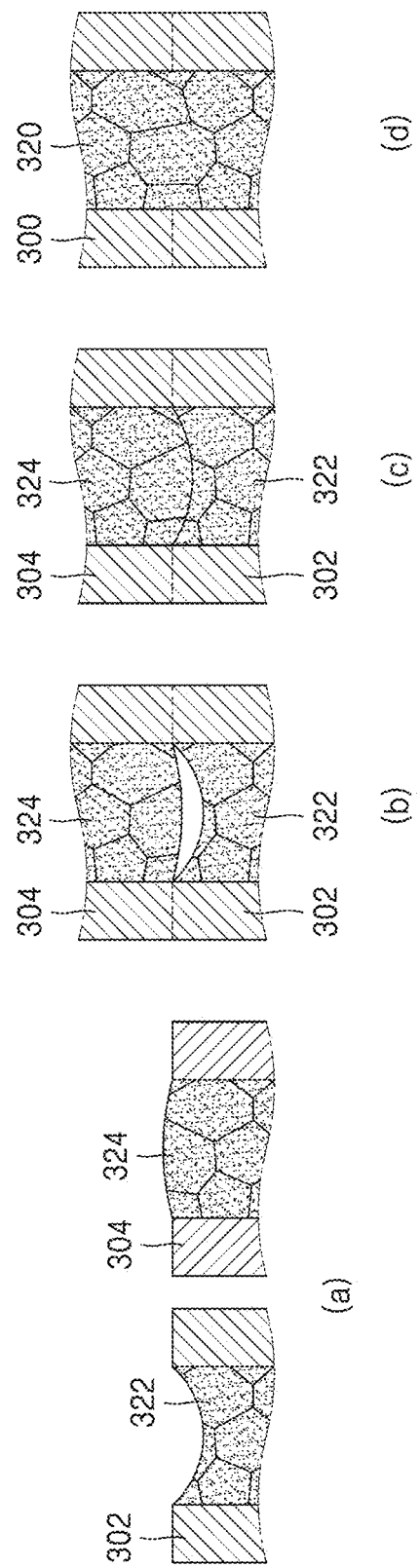

FIGS. 9 to 11 are cross-sectional views for conceptually explaining a process of forming a bonding pad in a method of manufacturing a semiconductor package, according to an embodiment of the inventive concepts.

Referring to FIG. 9, as shown in (a), the first chip connection pad 322 and the second chip connection pad 324 may have different horizontal widths, and by controlling the conditions of the planarization process for forming the first chip connection pad 322 and the second chip connection pad 324, an upper surface of one of the first chip connection pad 322 and the second chip connection pad 324 may protrude convexly, and the upper surface of the other may be concavely depressed. As shown in (b) by applying heat at a first temperature, the first chip bonding insulating material layer 302 and the second chip bonding insulating material layer 304 may be in contact with each other. When heat of the second temperature is applied, as shown in (c), after each of the first chip connection pad 322 and the second chip connection pad 324 expands and comes into contact with each other, as shown in (d), through diffusion of metal atoms included in each of the first chip connection pad 322 and the second chip connection pad 324, a bonding pad 325 constituting an integral body may be provided.

The first chip bonding insulating material layer 302 and the second chip bonding insulating material layer 304 are bonded to form a covalent bond, so that this may be a chip bonding insulating layer 300 constituting an integral body. Although not shown separately, the support bonding insulating layers 350, 350a, 352, and 352a may also be formed by performing substantially the same method as the method of forming the chip bonding insulating layer 300.

Referring to FIG. 10, as shown in (a), the first chip connection pad 322 and the second chip connection pad 324 may have the same horizontal width, and by controlling the conditions of the planarization process for forming the first chip connection pad 322 and the second chip connection pad 324, an upper surface of one of the first chip connection pad 322 and the second chip connection pad 324 may protrude convexly, and the upper surface of the other may be concavely depressed. As shown in (b) by applying heat at a first temperature, the first chip bonding insulating material layer 302 and the second chip bonding insulating material layer 304 may be in contact with each other. When heat of the second temperature is applied, as shown in (c), after each of the first chip connection pad 322 and the second chip connection pad 324 expands and comes into contact with each other, as shown in (d), through diffusion of metal atoms included in each of the first chip connection pad 322 and the second chip connection pad 324, a bonding pad 320 constituting an integral body may be provided.

The first chip bonding insulating material layer 302 and the second chip bonding insulating material layer 304 are bonded to form a covalent bond, so that this may be a chip bonding insulating layer 300 constituting an integral body.

Referring to FIG. 11, as shown in (a), the upper surface of each of the first chip connection pad 322 and the second chip connection pad 324 may be located on a coplanar surface with the upper surface of each of the first chip bonding insulating material layer 302 and the second chip bonding insulating material layer 304. In some embodiments, the first chip connection pad 322 and the second chip connection pad 324 may have the same horizontal width. In some other embodiments, the first chip connection pad 322 and the second chip connection pad 324 may have different horizontal widths. As shown in (b) by applying heat at a first temperature, the first chip bonding insulating material layer 302 and the second chip bonding insulating material layer 304 may be in contact with each other. When heat of the second temperature is applied, as shown in (c), through diffusion of metal atoms included in each of the first chip connection pad 322 and the second chip connection pad 324, a plurality of bonding pads 320 that are diffusion bonded may be provided to form an integral body.

The first chip bonding insulating material layer 302 and the second chip bonding insulating material layer 304 are bonded to form a covalent bond, so that this may be a chip bonding insulating layer 300 constituting an integral body.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the inventive concepts have been particularly shown and described with reference to embodiments thereof, it will be understood that various changes in form and details may be made therein without departing from the spirit and scope of the following claims.

What is claimed is:

1. A semiconductor package comprising:
    a first semiconductor chip including a first semiconductor substrate having an active surface and an inactive surface opposite to each other, and the first semiconductor chip including a plurality of first through electrodes penetrating at least a portion of the first semiconductor substrate;
a plurality of second semiconductor chips including a second semiconductor substrate having an active surface and an inactive surface opposite to each other, the active surface of the second semiconductor substrate facing the inactive surface of the first semiconductor substrate, the plurality of second semiconductor chips being stacked on the first semiconductor chip;
a plurality of bonding pads arranged between the first semiconductor chip and the plurality of second semiconductor chips;
a chip bonding insulating layer configured to surround the plurality of bonding pads and arranged between the first semiconductor chip and the plurality of second semiconductor chips; and
at least one supporting dummy substrate stacked on the plurality of second semiconductor chips and having a support bonding insulating layer arranged on a lower surface thereof,
wherein at least some of the plurality of second semiconductor chips comprise a plurality of second through electrodes penetrating at least a portion of the second semiconductor substrate,
wherein the plurality of bonding pads electrically connect the plurality of first through electrodes to the plurality of second through electrodes,
wherein a total vertical height of the at least one supporting dummy substrate is greater than respective vertical heights of the first semiconductor chip and the plurality of second semiconductor chips.

2. The semiconductor package of claim 1, wherein
the at least one supporting dummy substrate includes a plurality of supporting dummy substrates stacked on the plurality of second semiconductor chips, and
respective vertical heights of at least some of the plurality of supporting dummy substrates are equal to or less than respective vertical heights of the first semiconductor chip and the plurality of second semiconductor chips.

3. The semiconductor package of claim 2, wherein a vertical height of an uppermost supporting dummy substrate among the plurality of supporting dummy substrates is less than a vertical height of remaining supporting dummy substrates among the plurality of supporting dummy substrates.

4. The semiconductor package of claim 2, wherein a vertical height of an uppermost supporting dummy substrate among the plurality of supporting dummy substrates is greater than respective vertical heights of each of remaining supporting dummy substrates among the plurality of supporting dummy substrates, the first semiconductor chip, and the plurality of second semiconductor chips.

5. The semiconductor package of claim 1, wherein only one supporting dummy substrate having a vertical height greater than respective vertical heights of each of the first semiconductor chip and the plurality of second semiconductor chips is stacked on the plurality of second semiconductor chips.

6. The semiconductor package of claim 1, wherein horizontal widths of the plurality of second semiconductor chips are less than horizontal widths of the first semiconductor chip,
wherein a horizontal width of the at least one supporting dummy substrate is less than a horizontal width of the plurality of second semiconductor chips.

7. The semiconductor package of claim 1, wherein, in the support bonding insulating layer covering an upper surface of an uppermost second semiconductor chip among the plurality of second semiconductor chips, a thickness of a portion vertically overlapping with the at least one supporting dummy substrate is greater than that of a portion not vertically overlapping with the at least one supporting dummy substrate.

8. The semiconductor package of claim 1, wherein, in a chip bonding insulating layer covering an upper surface of the first semiconductor chip, a thickness of a portion overlapping with the plurality of second semiconductor chips in a vertical direction has a larger value than a portion that does not vertically overlap with the plurality of second semiconductor chips.

9. The semiconductor package of claim 1, wherein the at least one supporting dummy substrate is a part of a bare wafer,
wherein an uppermost second semiconductor chip among the plurality of second semiconductor chips does not have the second through electrodes,
wherein upper and lower surfaces of the support bonding insulating layer are in contact only with a semiconductor material.

10. The semiconductor package of claim 1, wherein each of the plurality of bonding pads, the chip bonding insulating layer, and the support bonding insulating layer is diffusion bonded to form an integral body.

11. A semiconductor package comprising:
a high bandwidth memory (HBM) controller die including a first semiconductor substrate having an active surface and an inactive surface opposite to each other, and the HBM controller die including a plurality of first through electrodes penetrating at least a portion of the first semiconductor substrate;
a plurality of dynamic random access memory (DRAM) dies including a second semiconductor substrate having an active surface and an inactive surface opposite to each other, the active surface of the second semiconductor substrate facing the inactive surface of the first semiconductor substrate, the plurality of DRAM dies being stacked on the first semiconductor substrate;
a plurality of bonding pads arranged between the HBM controller die and the plurality of DRAM dies;
a chip bonding insulating layer configured to surround the plurality of bonding pads and arranged between the HBM controller die and the plurality of DRAM dies; and
a plurality of supporting dummy substrates sequentially stacked on the plurality of DRAM dies and having a support bonding insulating layer attached to each lower surface thereof,
wherein remaining DRAM dies except for an uppermost DRAM die among the plurality of DRAM dies comprises a plurality of second through electrodes penetrating at least a portion of the second semiconductor substrate and electrically connected to the plurality of first through electrodes through the plurality of bonding pads,
wherein a vertical height of each of the plurality of supporting dummy substrates are equal to or less than a respective vertical heights of each of the first semiconductor substrate and the plurality of DRAM dies,
wherein a total vertical height of the plurality of supporting dummy substrates is greater than respective vertical heights of the first semiconductor substrate and the plurality of DRAM dies.

12. The semiconductor package of claim 11, further comprising:
- on the HBM controller die, a package molding layer that covers an upper surface of the HBM controller die, side surfaces of the plurality of DRAM dies, and side surfaces of the plurality of supporting dummy substrates, but exposes an upper surface of an uppermost supporting dummy substrate among the plurality of supporting dummy substrates without covering the upper surface of the uppermost supporting dummy substrate.

13. The semiconductor package of claim 11, wherein a vertical height of each of the plurality of supporting dummy substrates is equal to each other.

14. The semiconductor package of claim 11, wherein a vertical height of an uppermost supporting dummy substrate among the plurality of supporting dummy substrates is less than a vertical height of the remaining supporting dummy substrates among the plurality of supporting dummy substrates,
- wherein a vertical height of each of the remaining supporting dummy substrates except for the uppermost supporting dummy substrate among the plurality of supporting dummy substrates are equal.

15. The semiconductor package of claim 11, wherein the support bonding insulating layer is spaced apart from the plurality of second through electrodes without contacting.

16. The semiconductor package of claim 11, wherein each of the plurality of supporting dummy substrates has a same horizontal width as each other, which is less than a horizontal width of the plurality of DRAM dies.

17. The semiconductor package of claim 11, wherein the support bonding insulating layer filling between an upper surface of the uppermost DRAM die among the plurality of DRAM dies and a lowermost supporting dummy substrate among the plurality of supporting dummy substrates has a center portion protruding above an edge portion and has a flat lower surface.

18. A semiconductor package comprising:
- a high bandwidth memory (HBM) controller die including a first semiconductor substrate having an active surface and an inactive surface opposite to each other, and the HBM controller die including a plurality of first through electrodes penetrating at least a portion of the first semiconductor substrate, the HBM controller die having a first horizontal width and a first vertical height;
- a plurality of dynamic random access memory (DRAM) dies including a second semiconductor substrate having an active surface and an inactive surface opposite to each other, the active surface of the second semiconductor substrate facing the inactive surface of the first semiconductor substrate and is stacked on a first semiconductor chip, the plurality of DRAM dies each having a second horizontal width less than the first horizontal width and a second vertical height;
- a plurality of bonding pads arranged between the HBM controller die and the plurality of DRAM dies;
- a chip bonding insulating layer configured to surround the plurality of bonding pads and arranged between the HBM controller die and the plurality of DRAM dies;
- a plurality of supporting dummy substrates having a support bonding insulating layer attached to each lower surface thereof and sequentially stacked on the plurality of DRAM dies, and each having a third horizontal width less than the second horizontal width and a third vertical height equal to or less than the first vertical height and the second vertical height; and
- a package molding layer that covers an upper surface of the HBM controller die, side surfaces of the plurality of DRAM dies, and side surfaces of the plurality of supporting dummy substrates, but exposes an upper surface of an uppermost supporting dummy substrate among the plurality of supporting dummy substrates without covering the upper surface of the uppermost supporting dummy substrate,
- wherein vertical heights of the plurality of supporting dummy substrates are greater than the first vertical height and the second vertical height.

19. The semiconductor package of claim 18, wherein the third vertical height is about 50 μm to about 90 μm,
- wherein a total vertical height of the plurality of supporting dummy substrates is about 100 μm to about 500 μm.

20. The semiconductor package of claim 18, wherein the plurality of bonding pads comprise a material containing Cu,
- wherein each of the chip bonding insulating layer and the support bonding insulating layer comprises silicon oxide.

* * * * *